(12) United States Patent
Cho et al.

(10) Patent No.: US 9,793,424 B2
(45) Date of Patent: Oct. 17, 2017

(54) PHOTOELECTRIC CONVERSION DEVICE AND OPTICAL SIGNAL RECEIVING UNIT HAVING PHOTODIODE

(71) Applicant: SAMSUNG ELECTRONICS CO., LTD., Suwon-si, Gyeonggi-do (KR)

(72) Inventors: Keun-yeong Cho, Suwon-si (KR); Ho-chul Ji, Yongin-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 14/705,278

(22) Filed: May 6, 2015

(65) Prior Publication Data

US 2016/0049528 A1 Feb. 18, 2016

(30) Foreign Application Priority Data

Aug. 12, 2014 (KR) .................. 10-2014-0104537

(51) Int. Cl.
| | |
|---|---|
| *H01L 31/0232* | (2014.01) |
| *H01L 27/146* | (2006.01) |
| *H01L 31/0216* | (2014.01) |
| *H01L 31/105* | (2006.01) |
| *H01L 31/0352* | (2006.01) |
| *G02B 6/42* | (2006.01) |

(52) U.S. Cl.
CPC .......... *H01L 31/02327* (2013.01); *G02B 6/42* (2013.01); *H01L 27/14607* (2013.01); *H01L 27/14627* (2013.01); *H01L 27/14629* (2013.01); *H01L 31/02161* (2013.01); *H01L 31/035281* (2013.01); *H01L 31/105* (2013.01)

(58) Field of Classification Search
CPC ....... H01L 31/02327; H01L 31/035281; H01L 27/14607; H01L 27/14627; H01L 27/14629
See application file for complete search history.

(56) References Cited

U.S. PATENT DOCUMENTS

| | | | |
|---|---|---|---|
| 6,665,014 B1 | 12/2003 | Assadi et al. | |
| 7,989,859 B2 | 8/2011 | Mao et al. | |
| 2008/0036022 A1 | 2/2008 | Hwang et al. | |
| 2011/0227138 A1* | 9/2011 | Haddad | H01L 27/14609 257/291 |
| 2012/0050554 A1* | 3/2012 | Levine | H01L 27/14627 348/216.1 |
| 2012/0168613 A1 | 7/2012 | Yu et al. | |

(Continued)

FOREIGN PATENT DOCUMENTS

| | | |
|---|---|---|
| CN | 101276821 A | 10/2008 |
| CN | 102738090 A | 10/2012 |

(Continued)

*Primary Examiner* — Daniel Luke
(74) *Attorney, Agent, or Firm* — Lee & Morse, P.C.

(57) ABSTRACT

A photoelectric conversion device includes a substrate having a first surface and a second surface that is an opposite side of the first surface, wherein one of the first and second surfaces is a light incidence surface, a photodiode (PD) formed in the first surface of the substrate, a reflective layer formed on one of the first and second surfaces of the substrate, which is the opposite side of the light incidence surface, and a microlens formed on the light incidence surface of the substrate.

17 Claims, 28 Drawing Sheets

(56) References Cited

U.S. PATENT DOCUMENTS

| | | | | |
|---|---|---|---|---|
| 2014/0001521 A1* | 1/2014 | Pagani | ............... | H01L 31/105 |
| | | | | 257/290 |
| 2014/0077323 A1 | 3/2014 | Velichko et al. | | |
| 2014/0090705 A1 | 4/2014 | Hayashi et al. | | |
| 2014/0159183 A1* | 6/2014 | Na | ............... | H01L 31/022408 |
| | | | | 257/432 |
| 2014/0167107 A1* | 6/2014 | Yoneda | ............ | H01L 31/03042 |
| | | | | 257/184 |

FOREIGN PATENT DOCUMENTS

| | | |
|---|---|---|
| JP | 2003-158291 A | 5/2003 |
| JP | 2009-188316 A | 8/2009 |
| JP | 2010-206128 A | 9/2010 |
| KR | 10-0720482 B1 | 5/2007 |
| KR | 10-2013-0006904 A | 1/2013 |

\* cited by examiner

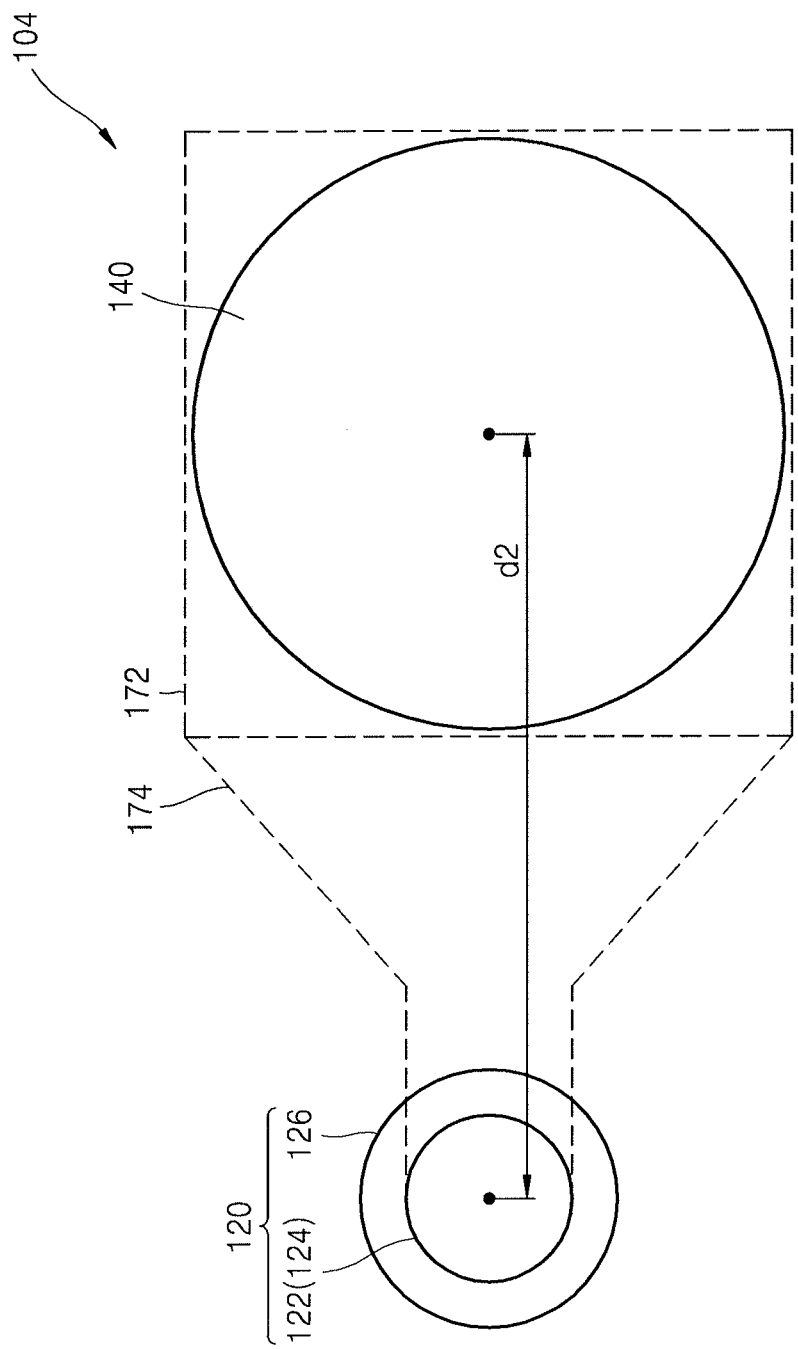

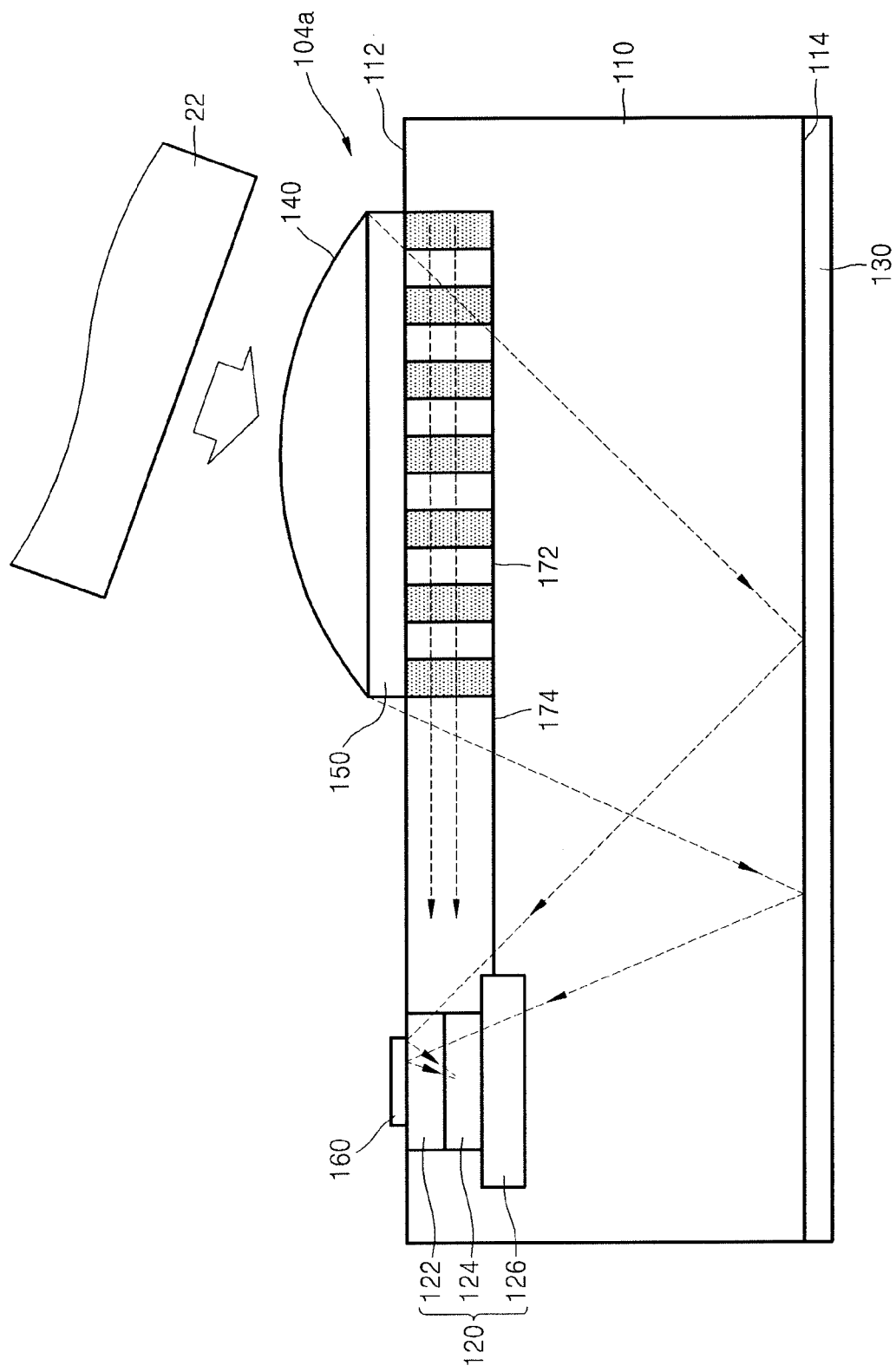

PHOTOELECTRIC CONVERSION DEVICE AND OPTICAL SIGNAL RECEIVING UNIT HAVING PHOTODIODE

CROSS-REFERENCE TO RELATED APPLICATION

Korean Patent Application No. 10-2014-0104537, filed on Aug. 12, 2014, in the Korean Intellectual Property Office, and entitled: "Photoelectric Conversion Device and Optical Signal Receiving Unit Having Photodiode," is incorporated by reference herein in its entirety.

BACKGROUND

1. Field

Embodiments relate to a photoelectric conversion device and optical signal receiving unit having a photodiode (PD).

2. Description of the Related Art

With the rapid development of the electronics industry and at users' request, increasing the speed of electronic devices has been required more and more. Thus, it has also become increasingly necessary to accelerate internal communication of electronic devices or communication of the electronic devices with external devices. As a result, high-speed communication using light has been introduced.

SUMMARY

Embodiments are directed to a photoelectric conversion device including a substrate having a first surface and a second surface that is an opposite side of the first surface, wherein one of the first and second surfaces is a light incidence surface, a PD formed in the first surface of the substrate, a reflective layer formed on one of the first and second surfaces of the substrate, which is the opposite side of the light incidence surface, and a microlens formed on the light incidence surface of the substrate.

The PD may include a first conductivity-type semiconductor layer, a second conductivity-type semiconductor layer and a light absorptive semiconductor layer interposed between the first and second conductivity-type semiconductor layers.

The first conductivity-type semiconductor layer, the light absorptive semiconductor layer, and the second conductivity-type semiconductor layer may be arranged in a vertical direction from the first surface of the substrate.

A horizontal area of the first conductivity-type semiconductor layer may be less than a horizontal area of the second conductivity-type semiconductor layer.

A horizontal area of the light absorptive semiconductor layer may be less than a horizontal area of the second conductivity-type semiconductor layer.

A horizontal area of the microlens may be larger than a horizontal area of the light absorptive semiconductor layer.

A center of the microlens may be offset from a center of the light absorptive semiconductor layer.

The photoelectric conversion device may further include a reflective metal layer covering a portion of the PD.

The first conductivity-type semiconductor layer, the light absorptive semiconductor layer, and the second conductivity-type semiconductor layer may be arranged in a direction parallel to the first surface of the substrate.

The photoelectric conversion device may further include a lattice coupler formed on the first surface of the substrate and a waveguide interposed between the lattice coupler and the PD, and the microlens may be formed on the lattice coupler.

The light incidence surface may be the first surface of the substrate.

The light incidence surface may be the second surface of the substrate, and the reflective layer may be formed on the PD.

The photoelectric conversion device may further include an anti-reflective layer interposed between the substrate and the microlens.

The photoelectric conversion device may further include an optical isolator layer interposed between the substrate and the microlens.

The reflective layer may have a concave shape toward the PD.

Embodiments are also directed to a photoelectric conversion device including a substrate having a first surface and a second surface that is an opposite side of the first surface, a PD formed in the first surface of the substrate, a microlens formed on the first surface of the substrate and to which light is incident, and a reflective layer formed on the second surface of the substrate and configured to reflect light incident through the microlens, toward the PD.

The PD, a first conductivity-type semiconductor layer, a second conductivity-type semiconductor layer, and a light absorptive semiconductor layer interposed between the first and second conductivity-type semiconductor layers may be disposed in a vertical direction from the first surface of the substrate. A horizontal area of the second conductivity-type semiconductor layer may be larger than a horizontal area of the first conductivity-type semiconductor layer.

A horizontal area of the microlens may be larger than a horizontal area of the second conductivity-type semiconductor layer.

A center of the microlens may be offset from a center of the light absorptive semiconductor layer.

At least a portion of the light absorptive semiconductor layer may not overlap the microlens in a vertical direction to the first surface of the substrate.

Embodiments are also directed to an optical signal receiving unit including a photoelectric conversion device including a substrate having a first surface and a second surface that is an opposite side of the first surface, a PD formed in the first surface of the substrate, a microlens formed on the first surface of the substrate and to which an optical signal is incident, and a reflective layer formed on the second surface of the substrate to reflect the optical signal incident through the microlens, toward the PD, and an optical cable including a fiber core having a larger sectional area than a horizontal area of the PD. A central axis of the optical cable corresponding to the microlens has an angle with respect to a normal line of the first surface of the substrate.

The PD may include a first conductivity-type semiconductor layer, a second conductivity-type semiconductor layer, and a light absorptive semiconductor layer interposed between the first and second conductivity-type semiconductor layers. A center of the microlens may be offset from a center of the light absorptive semiconductor layer.

The center of the microlens may be offset from the center of the light absorptive semiconductor layer by a distance of $2 \times t \times \tan \theta$, wherein t is a thickness of the substrate, and $\theta$ is an angle formed by the optical cable with the normal line of the first surface of the substrate.

A thickness of the substrate may be FL×cos θ/2, wherein FL is a focal length of the microlens, and θ is an angle formed by the optical cable with the normal line of the first surface of the substrate.

The optical signal receiving unit may further include a reflective metal layer formed on the PD.

A horizontal area of the reflective metal layer may be less than a horizontal area of the light absorptive semiconductor layer.

Embodiments are also directed to an optical signal receiving unit including a semiconductor chip including a substrate having a first surface and a second surface that is an opposite side of the first surface, a photodiode (PD) and a signal processing semiconductor device formed on the first surface of the substrate, a microlens formed on the first surface of the substrate, and a reflective layer formed on the second surface of the substrate to reflect an optical signal incident through the microlens, toward the PD, an optical cable configured to allow an optical signal to be incident toward the microlens to have an angle with respect to a normal line of the first surface of the substrate, and a signal terminal unit electrically connected to the signal processing semiconductor device and configured to receive photocurrent into which the optical signal is converted by the PD, and output an electric signal processed by the signal processing semiconductor device.

The PD may include a first conductivity-type semiconductor layer, a second conductivity-type semiconductor layer and a light absorptive semiconductor layer interposed between the first and second conductivity-type semiconductor layers. The optical cable may include a fiber core having a larger sectional area than a horizontal area of the light absorptive semiconductor layer.

Respective centers of the first conductivity-type semiconductor layer, the light absorptive semiconductor layer, and the second conductivity-type semiconductor layer may be aligned in a vertical direction to the first surface of the substrate. A center of the microlens may be offset from the center of the light absorptive semiconductor layer in a horizontal direction with respect to the first surface of the substrate.

A thickness of the substrate may be larger than or equal to (FL/2)×0.95 and less than or equal to (FL/2)×1.05, wherein FL is a focal length of the microlens.

Embodiments are also directed to an apparatus, including an optical input, the optical input receiving light traveling in a first direction, a reflector, the light received at the optical input being directed to the reflector, a lens disposed in a path of the light between the optical input and the reflector such that light from the optical input that impinges on the reflector passes through the lens, the lens directing the light to the reflector, at least some of the light impinging on the lens being directed in a direction different from the first direction, and an optoelectronic element disposed in a path of the light, the optoelectronic element exhibiting an electrical state variable in response to changes in light impinging on the optoelectronic element.

All light input via the optical input and impinging on the reflector may pass through the lens.

The lens may be a refractive element and has a curve, and a normal to a tangent at the center of the lens may intersect the lens, the optoelectronic element, and the reflector.

The lens may be a refractive element and have a curve, and a normal to a tangent at the center of the lens may intersect the lens and the reflector, and the optoelectronic element may be laterally offset from the center of the lens.

Light input via the optical input may impinge on the optoelectronic element at two opposite surfaces of the optoelectronic element.

BRIEF DESCRIPTION OF THE DRAWINGS

Features will become apparent to those of skill in the art by describing in detail example embodiments with reference to the attached drawings in which:

FIG. 14B illustrates a plan view showing the layout of a PD and a microlens in the photoelectric conversion device shown in FIG. 14A;

FIG. 15A illustrates a cross-sectional view of part of a photoelectric conversion device according to an example embodiment;

DETAILED DESCRIPTION

Figure 1:
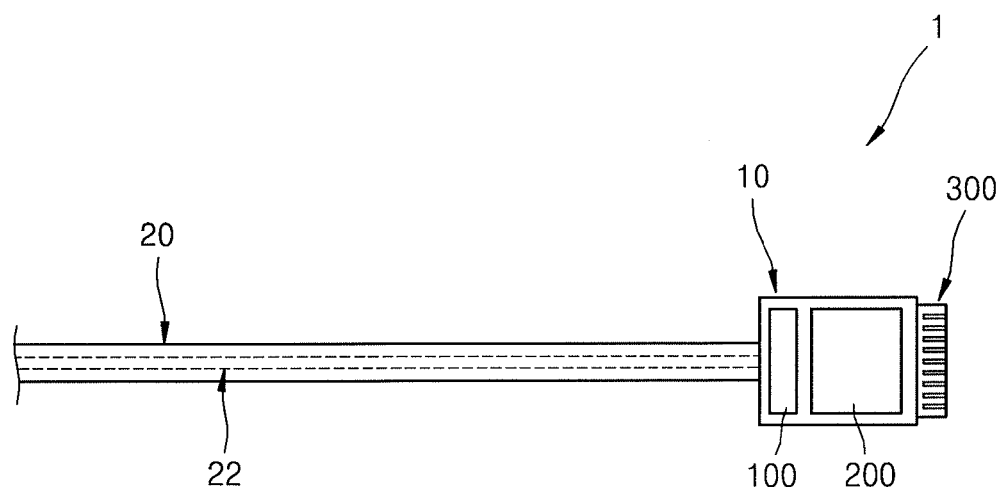
FIG. 1 illustrates a diagram of part of an optical signal receiving unit according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, the term "and/or" includes any and all combinations of one or more of the associated listed items. Expressions such as "at least one" of when preceding a list of elements, modify the entire list of elements and do not modify the individual elements of the list.

It will be understood that when an element or layer is referred to as being "on" or "in contact with" another element or layer, it can be directly on or in direct contact with the other element or layer or intervening elements or layers may be present. In contrast, when an element is referred to as being "directly on" or "in direct contact with" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

It will be understood that, although the terms "first", "second", etc. may be used herein in reference to elements of embodiments, such elements should not be construed as limited by these terms. These terms are only used to distinguish one element from another. For example, a first element could be termed a second element, and a second element could be termed a first element, without departing from the scope of embodiments.

The articles "a", "an", and "the" are singular in that they have a single referent, however the use of the singular form in the present document should not preclude the presence of more than one referent. In other words, elements of embodiments referred to in the singular may number one or more, unless the context clearly indicates otherwise. It will be further understood that the terms "comprises", "comprising", "includes", and/or "including" when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein have the same meaning as commonly understood by one of ordinary skill in the art to which this inventive concept belongs.

FIG. 1 illustrates a diagram of part of an optical signal receiving unit 1 according to an example embodiment.

Referring to FIG. 1, the optical signal receiving unit 1 may include a semiconductor chip 10 and an optical cable 20.

The optical signal receiving unit 1 may be, for example, an active optical cable.

Although the present embodiment describes a case in which the optical signal receiving unit 1 is a unit configured to receive an optical signal, the optical signal receiving unit 1 may also function to transmit an optical signal.

The semiconductor chip 10 may include a photoelectric conversion device 100 and a signal processing semiconductor device 200. Although the present embodiment describes a case in which the photoelectric conversion device 100 functions to convert an optical signal into an electric signal, the photoelectric conversion device 100 may also function to convert an electric signal into an optical signal. The formation of the semiconductor chip 10 may include forming a plurality of semiconductor chips on a semiconductor wafer, thinning out the semiconductor wafer by using a back-lap process, and separating the semiconductor device into individual semiconductor chips 10 by using a die-sawing process. As described below, even if the semiconductor wafer is thinned out using a back-lap process, the photoelectric conversion device 100 according to the example embodiment may improve the absorptivity of light incident to the photoelectric conversion device 100.

The photoelectric conversion device 100 may receive an optical signal and perform a photoelectric conversion operation of converting the optical signal into photocurrent as an electric signal. The photoelectric conversion device 100 may include, for example, one PD or a plurality of PDs. A case in which the photoelectric conversion device 100 includes one PD will be described as an example. The photoelectric conversion device 100 may include, for example, a PIN diode.

The signal processing semiconductor device 200 may perform a signal processing operation on the photocurrent generated by the photoelectric conversion device 100. The signal processing semiconductor device 200 may perform a signal processing operation using various methods, for example, a decoding process, an encoding process, and an amplification process. An electric signal generated due to the signal processing operation performed by the signal processing semiconductor device 200 may be output through a signal terminal unit 300 that is electrically connected to the signal processing semiconductor device 200.

The signal processing semiconductor device 200 and the signal terminal unit 300 may be variously configured according to a communication specification supported by the optical signal receiving unit 1. For example, the optical signal receiving unit 1 may support an enhanced small form-factor pluggable (SFP+) specification to support a data transmission speed of about 10 Gb/s or higher. In this case, the signal processing semiconductor device 200 and the signal terminal unit 300 may be configured to support the SFP+specification.

The optical cable 20 may include, for example, one or a plurality of optical fibers. The optical fiber may include a fiber core 22 through which light containing a signal (i.e., an optical signal) is transmitted, and a cladding material surrounding the fiber core 22. In the present embodiment, an example in which the optical fiber of the optical cable 20 includes one fiber core 22 is illustrated and will be described.

In the present specification, "light" may be mainly used to describe physical characteristics (e.g., reflection) of light, while an "optical signal" may be mainly used to describe light having a signal for data communication. However, as used herein, light and an optical signal have substantially the same meaning and can be used interchangeably.

In the present specification, a direction in which light or an optical signal travels or is incident indicates not a direction in which each light wave transmitted through the fiber core 22 travels, but a direction in which all the light waves transmitted through the fiber core 22 travel. Accordingly, as used herein, the direction in which light or an optical signal travels or is incident indicates a normal direction to a sectional area of the fiber core 22. Also, when used herein, an angle formed by the optical cable 20 indicates an angle formed by a direction in which light or an optical signal travels or is incident from one end of the optical cable 20 toward the photoelectric conversion device 100 with a reference direction (e.g., a vertical direction to a first surface (refer to 112 in FIG. 2A)) or a direction of a reference line (e.g., a normal direction). Specifically, when used herein, the angle formed by the optical cable 20 indicates an angle formed by a normal direction to the sectional area of the fiber core 22 at one end of the optical cable 20 to which light or an optical signal is provided (i.e., a direction of a central axis of the optical cable 20), with the reference direction or the direction of the reference line.

Figure 2A:
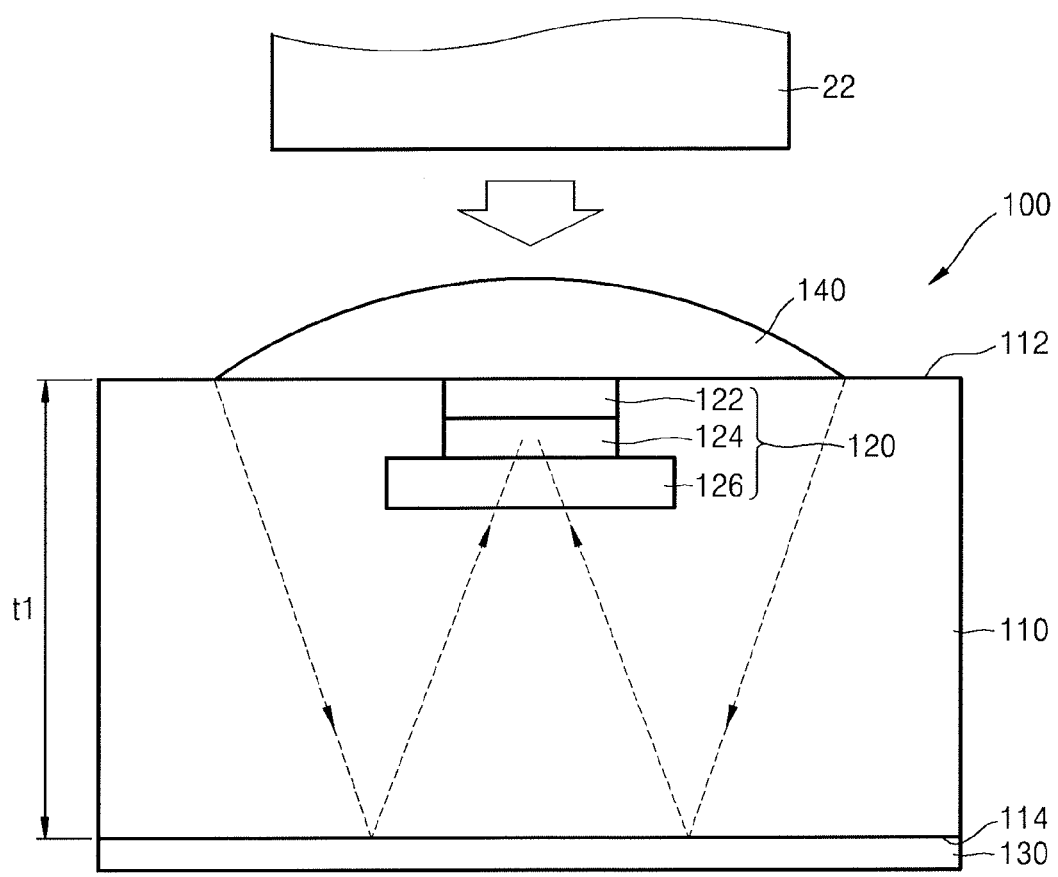
FIG. 2A illustrates a cross-sectional view of part of a photoelectric conversion device according to an example embodiment.

FIG. 2A illustrates a cross-sectional view of part of the photoelectric conversion device 100 of FIG. 1 according to an example embodiment.

Figure 2B:
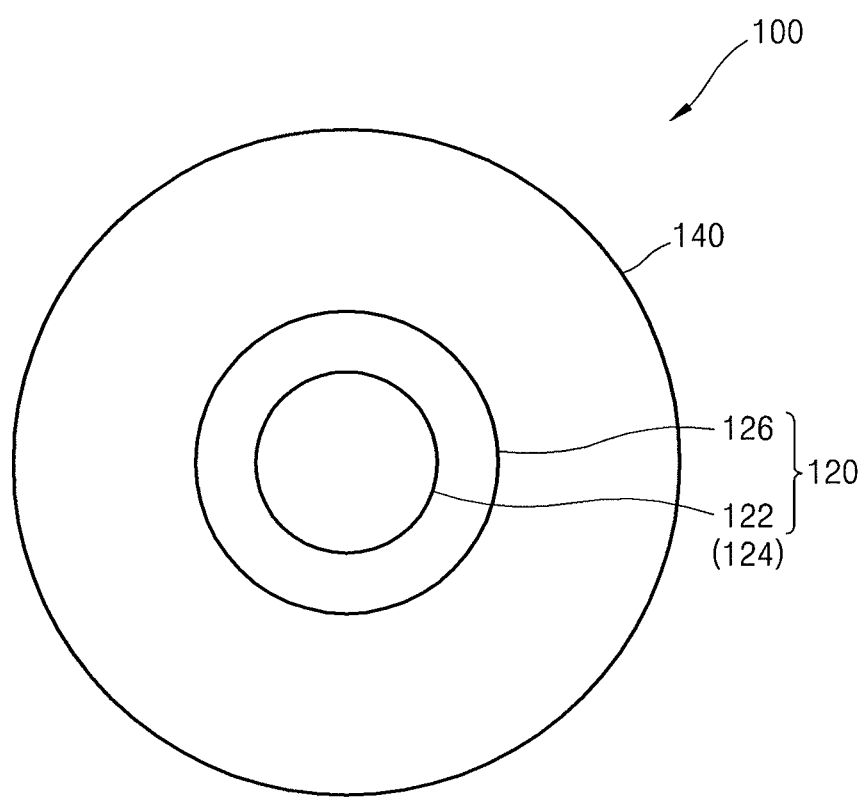
FIG. 2B illustrates a plan view showing the layout of part of a photoelectric conversion device according to an example embodiment, specifically, a plan view showing the layout of a photodiode (PD) and a microlens in the photoelectric conversion device shown in FIG. 2A.

FIG. 2B illustrates a plan view showing the layout of part of a photoelectric conversion device according to an example embodiment, specifically, a plan view showing the layout of a photodiode (PD) and a microlens in the photoelectric conversion device 100 shown in FIG. 2A.

Referring to FIGS. 2A and 2B, the photoelectric conversion device 100 may include a substrate 110, a PD 120, a reflective layer 130, and a microlens 140.

The substrate 110 may include a first surface 112 and a second surface 114 that is an opposite side of the first surface 112, and the PD 120 may be formed on the first surface 112 of the substrate 110.

The PD 120 may be a PIN diode including a first conductivity-type semiconductor layer 122, a light absorptive semiconductor layer 124, and a second conductivity-type semiconductor layer 126. The light absorptive semiconductor layer 124 may be interposed between the first conductivity-type semiconductor layer 122 and the second conductivity-type semiconductor layer 126. The first conductivity-type semiconductor layer 122, the light absorptive semiconductor layer 124, and the second conductivity-type semiconductor layer 126 may be arranged in a vertical direction from the first surface 112 of the substrate 110.

The first conductivity-type semiconductor layer 122 and the second conductivity-type semiconductor layer 126 may be of a p conductivity type and an n conductivity type, respectively. In another implementation, the first conductivity-type semiconductor layer 122 and the second conductivity-type semiconductor layer 126 may be of an n conductivity type and a p conductivity type, respectively. The light absorptive semiconductor layer 124 may be formed of an intrinsic semiconductor material or have a relatively low dopant concentration. The first conductivity-type semiconductor layer 122 and the second conductivity-type semiconductor layer 126 may have a relatively high dopant concentration. For example, each of the first conductivity-type semiconductor layer 122 and the second conductivity-type semiconductor layer 126 may have such a sufficient dopant concentration as to form an ohmic contact with a conductive contact plug that may be in contact with the corresponding one of the first and second conductivity-type semiconductor layers 122 and 126. As compared with the first conductivity-type semiconductor layer 122 and the second conductivity-type semiconductor layer 126, the light absorptive semiconductor layer 124 may have as low a dopant concentration as an intrinsic semiconductor.

The substrate 110 may include, for example, silicon (Si). In another implementation, the substrate 110 may include an elemental semiconductor, such as germanium (Ge) or a semiconductor compound, such as silicon carbide (SiC), gallium arsenide (GaAs), indium arsenide (InAs), and indium phosphide (InP). In another implementation, the substrate 110 may have a silicon-on-insulator (SOI) structure. For example, the substrate 110 may include a buried oxide (BOX) layer. The substrate 110 may include a conductive region, for example, a doped well or a doped structure.

The substrate 110 may include an interlayer insulating material layer formed on a semiconductor substrate. The light absorptive semiconductor layer 124 may be electrically insulated from the periphery thereof by the interlayer insulating material layer or an additional isolation insulating layer.

For example, the substrate 110 may include a semiconductor substrate having a top surface corresponding to or adjacent to a bottom surface of the PD 120 and an interlayer insulating material layer formed on the semiconductor substrate to cover at least a portion of a side surface of the PD 120. For example, the substrate 110 may have a semiconductor substrate having a top surface corresponding to or adjacent to a bottom surface of the light absorptive semiconductor layer 124, and an interlayer insulating material layer formed on the semiconductor substrate to cover at least portions of side surfaces of the first conductivity-type semiconductor layer 122 and the light absorptive semiconductor layer 124. For example, the substrate 110 may include a semiconductor substrate having a top surface corresponding to or adjacent to a bottom surface of the first conductivity-type semiconductor layer 122, and an interlayer insulating material layer formed on the semiconductor substrate to cover at least a portion of the side surface of the first conductivity-type semiconductor layer 122.

The PD 120 may be formed by sequentially stacking the second conductivity-type semiconductor layer 126, the light absorptive semiconductor layer 124, and the first conductivity-type semiconductor layer 122 on the semiconductor substrate. In another implementation, the formation of the PD 120 may include forming the second conductivity-type semiconductor layer 126 by implanting a second conductivity-type dopant into the semiconductor substrate, and sequentially stacking the light absorptive semiconductor layer 124 and the first conductivity-type semiconductor layer 122. In another implementation, the formation of the PD 120 may include forming the second conductivity-type semiconductor layer 126 and the light absorptive semiconductor layer 124 in the semiconductor substrate, and stacking the first conductivity-type semiconductor layer 122 thereon. In another implementation, the formation of the PD 120 may include stacking the second conductivity-type semiconductor layer 126, the light absorptive semiconductor layer 124, and the first conductivity-type semiconductor layer 122 in the semiconductor substrate.

A conductive contact plug, configured to transmit photocurrent generated by the PD 120 to the outside of the PD 120, may be formed on and connected to each of the first conductivity-type semiconductor layer 122 and the second conductivity-type semiconductor layer 126. Also, a conductive interconnection, which may be connected to the conductive contact plug, may be formed on the PD 120 and supply photocurrent to the signal processing semiconductor device 200 shown in FIG. 1.

The reflective layer 130 may be formed on the second surface 114 of the substrate 110, and the microlens 140 may be formed on the first surface 112 of the substrate 110. The reflective layer 130 may reflect light incident through the microlens 140, toward the PD 120.

The reflective layer 130 may be, for example, a metal material layer or a multilayered insulating layer. The reflective layer 130 may include, for example, at least one of aluminum (Al), silver (Ag), an alloy thereof, a silver-based oxide (Ag—O), a silver (Ag)-palladium (Pd)-copper (Cu) (APC) alloy (an alloy containing Ag, Pd, and Cu), rhodium (Rh), copper (Cu), palladium (Pd), nickel (Ni), ruthenium (Ru), iridium (Ir) and platinum (Pt). The reflective layer 130 may be, for example, a distributed Bragg reflector (DBR). The reflective layer 130 may include, for example, a plurality of alternately stacked layers, each of which may have a thickness of "$m\lambda/4n$". Herein, $\lambda$ denotes the wavelength of reflected light, n denotes the refractive index of a medium, and m is an odd number. For example, the reflective layer 130 may have a stack structure obtained by sequentially and alternately stacking low refractive index layers and high refractive index layers. A low refractive index layer may include, for example, silicon oxide ($SiO_2$) having a refractive index of 1.4 or aluminum oxide ($Al_2O_3$) having a refractive index of 1.6. A high refractive index layer may include, for example, silicon nitride ($Si_3N_4$) having a refractive index of 2.05 to 2.25, titanium nitride ($TiO_2$) having a refractive index of 2 or more, or silicon-hydrogen (Si—H) having a refractive index of 3 or more.

The microlens 140 may have an optical power. The microlens 140 may focus light coming from the optical cable 20. In the present example embodiment, the microlens 140 is illustrated as a refractive element, but other optical elements may be used for the microlens 140. The microlens 140 may include a TMR-based resin (a product of Tokyo Ohka Kogyo, Co.) or an MFR-based resin (a product of Japan Synthetic Rubber Corporation). Although it is illustrated that the microlens 140 is formed directly on the PD 120, particularly, the first conductivity-type semiconductor layer 122 of the PD 120, a transparent insulating layer may be further formed between the microlens 140 and the first conductivity-type semiconductor layer 122 of the PD 120.

Light provided from a fiber core 22 of an optical fiber included in the optical cable (refer to 20 in FIG. 1) may be incident through the microlens 140 to the first substrate 112 of the substrate 110. A direction in which light is incident from the fiber core 22 may be a vertical direction to the first surface 112 of the substrate 110. The first surface 112 of the substrate 110 may be a light incidence surface.

Light incident to the substrate 110 may be absorbed by the light absorptive semiconductor layer 124 of the PD 120 so that the PD 120 may generate photocurrent. Light that is not absorbed by the light absorptive semiconductor layer 124 of the PD 120 may be reflected by the reflective layer 130 formed on the second surface 114, which is the opposite side of the light incidence surface, and absorbed again by the light absorptive semiconductor layer 124 of the PD 120.

The first conductivity-type semiconductor layer 122 may have a smaller horizontal area than the second conductivity-type semiconductor layer 126. The light absorptive semiconductor layer 124 may have a smaller horizontal area than the second conductivity-type semiconductor layer 126. The second conductivity-type semiconductor layer 126 may have a greater horizontal area than each of the first conductivity-type semiconductor layer 122 and the light absorptive semiconductor layer 124.

In the present specification, a horizontal area indicates an area measured in a horizontal direction with respect to the first surface 112 or the second surface 114 of the substrate 110, and unless otherwise defined, an area indicates the horizontal area. Also, when used herein, a horizontal area of the PD 120 may indicate the largest horizontal area of respective horizontal areas of the first conductivity-type semiconductor layer 122, the light absorptive semiconductor layer 124, and the second conductivity-type semiconductor layer 126, which may constitute the PD 120.

Centers of the first conductivity-type semiconductor layer 122, the light absorptive semiconductor layer 124, and the second conductivity-type semiconductor layer 126 may be aligned along the vertical direction with respect to the first surface 112 of the substrate 110.

When the substrate 110 is seen from the first surface 112, a portion of the second conductivity-type semiconductor layer 126 may not be covered by the first conductivity-type semiconductor layer 122 and the light absorptive semiconductor layer 124. A conductive contact plug may be formed in the portion of the semiconductor-conductivity-type semiconductor layer 126, which is not covered by the first conductivity-type semiconductor layer 122 and the light absorptive semiconductor layer 124, and electrically connected to the second conductivity-type semiconductor layer 126. The conductive contact plug may be formed on a top surface of the first conductivity-type semiconductor layer 122 and electrically connected to the first conductivity-type semiconductor layer 122. The light absorptive semiconductor layer 124 may be disposed to completely fill a space between the first conductivity-type semiconductor layer 122 and the second conductivity-type semiconductor layer 126.

When the first conductivity-type semiconductor layer 122, the light absorptive semiconductor layer 124, and the second conductivity-type semiconductor layer 126, which may form the PD 120, are vertically stacked, a horizontal area of the second conductivity-type semiconductor layer 126 disposed at a lower side may be formed to be larger than a horizontal area of each of the first conductivity-type semiconductor layer 122 and the light absorptive semiconductor layer 124 disposed at an upper side. Thus, the conductive contact plug may be formed to be electrically connected to the first conductivity-type semiconductor layer 122 and the second conductivity-type semiconductor layer 126 and electrically connected to the first surface 112 of the substrate 110 in a vertical direction.

A horizontal area of the microlens 140 may be larger than a horizontal area of each of the first conductivity-type semiconductor layer 122, the light absorptive semiconductor layer 124, and the second conductivity-type semiconductor layer 126. A sectional area of the fiber core 22 may be larger than a horizontal area of the PD 120. The sectional area of the fiber core 22 may be larger than a sectional area of the light absorptive semiconductor layer 124. Since the sectional area of the fiber core 22 depends on the type of an optical fiber forming an optical cable (refer to 20 in FIG. 1), the sectional area of the fiber core 22 may be generally uniform or vary within a very small range. A diameter of the light absorptive semiconductor layer 124 may be inversely proportional to a bandwidth of an optical signal that may be processed by the photoelectric conversion device 100. Thus, as the diameter of the light absorptive semiconductor layer 124 decreases, the photoelectric conversion device 100 may process optical signals for higher speed communication. Accordingly, when the photoelectric conversion device 100 is configured for higher speed communication, the sectional area of the fiber core 22 may become relatively larger than the horizontal area of the PD 120 (particularly, the horizontal area of the light absorptive semiconductor layer 124).

For example, when the bandwidth of the optical signal is about 10 Gbps or more, the diameter of the fiber core 22 may be about 50 µm or about 62.5 µm, and the diameter of the PD 120, particularly, the diameter of the light absorptive semiconductor layer 122 may range from about 5 µm to about 40 µm.

The microlens 140 may be formed to have a horizontal area corresponding to the sectional area of the fiber core 22. For example, the horizontal area of the microlens 140 may be equal to or larger than the sectional area of the fiber core 22. Most of light incident from the fiber core 22 to the photoelectric conversion device 100 may reach the microlens 140. When the microlens 140 is a convex lens, while light that has passed through the microlens 140 is traveling through the photoelectric conversion device 100, a beam size of the light may be gradually reduced. Here, the beam size of the light refers to an area through which light travels through the photoelectric conversion device 100. When the PD 120 is formed on the first surface 112 of the substrate 110, only part of light passing through the microlens 140 may reach the light absorptive semiconductor layer 124.

Light that does not reach the light absorptive semiconductor layer 124 or light that reaches the light absorptive semiconductor layer 124 but is not absorbed by the light absorptive semiconductor layer 124 may reach the reflective layer 130 while the beam size of the light gradually reduces. Thereafter, the light may be reflected by the reflective layer 130 and travel from the second surface 114 of the substrate 110 toward the first surface 112 thereof while the beam size of the light continuously reduces. Accordingly, most of light that is reflected by the reflective layer 130 and travels from the second surface 114 of the substrate 110 toward the first surface 112 thereof may reach the light absorptive semiconductor layer 124.

When a thickness and area of the PD 120 are less than a thickness t1 of the substrate 110, the thickness t1 of the substrate 110 may be about half the focal length FL of the microlens 140. In this case, since most of light reflected by the reflective layer 130 may reach the PD 120, particularly, the light absorptive semiconductor layer 124, the light absorption efficiency of the PD 120 may be improved.

In consideration of a thickness of the PD 120, a depth of focus (DOF) of the microlens 140, a thickness of a transparent insulating layer that may be formed between the PD 120 and the microlens 140, and process tolerances, the thickness t1 of the substrate 110 may be formed within a range of half of the focal length of the microlens 140, ±5%, to improve the light absorption efficiency of the PD 120.

For example, the thickness t1 of the substrate 110 may range from several tens of µm to several hundreds of µm, and the PD 120 may have a thickness of several µm or less and a diameter of several µm to several tens of µm.

The photoelectric conversion device 100 may absorb light that directly reaches the PD 120 (particularly, the light absorptive semiconductor layer 124) through the first surface 112 of the substrate 110, and light that is reflected by the reflective layer 130 formed on the second surface 114 of the substrate 110 and reaches the light absorptive semiconductor layer 124, and generate photocurrent, thereby improving the light absorption efficiency of the photoelectric conversion device 100.

The photoelectric conversion device 100 may condense light by using the microlens 140. Thus, the photoelectric conversion device 100 may process optical signals for high-speed communication.

As shown in FIG. 1, when the photoelectric conversion device 100 is not formed in an additional semiconductor chip but is formed in a single semiconductor chip 10 along with the semiconductor device 200, the thickness t1 of the substrate 110 may be thinned out using a back-lap process during the formation of the semiconductor chip 10. However, when incident light is reflected by the reflective layer 130 and reaches the PD 120, a distance by which light travels may be about twice the thickness t1 of the substrate 110. Accordingly, even if a thick transparent insulating layer is not formed on the microlens 140 and the PD 120 to ensure a focal length, the focal length of the microlens 140 may be ensured. Thus, light absorption efficiency at which light incident to the photoelectric conversion device 100 is absorbed by the PD 120 may be improved.

When a thick transparent insulating layer is formed to ensure the focal length, the thick transparent insulating layer may be formed on the signal processing semiconductor device 200 formed in the single semiconductor chip 10 along with the photoelectric conversion device 100, or a big step difference may occur between the photoelectric conversion device 100 and the signal processing semiconductor device 200. Thus, the semiconductor chip 10 may be damaged or performance of the signal processing semiconductor device 200 may be degraded. However, the photoelectric conversion device 100 according to the present example embodiment may ensure a focal length even if a thick transparent insulating layer is not formed. Thus, damage to the semiconductor chip 10 or performance degradation of the signal processing semiconductor device 200 may be prevented. Therefore, the photoelectric conversion device 100 and the optical signal receiving unit 1 according to the example embodiment may minimize loss and may be downscaled.

It will be understood that each of photoelectric conversion devices 100a, 100b, 100c, 100d, 101, 101a, 101b, 101c, 101d, 102, 103, 104, 104a, 104b, 105, 105a, 106, and 106a shown in FIGS. 3 through 20 as described below may correspond to the photoelectric conversion device 100 of the optical signal receiving unit 1 shown in FIG. 1, and repeated descriptions may be omitted.

Figure 3:
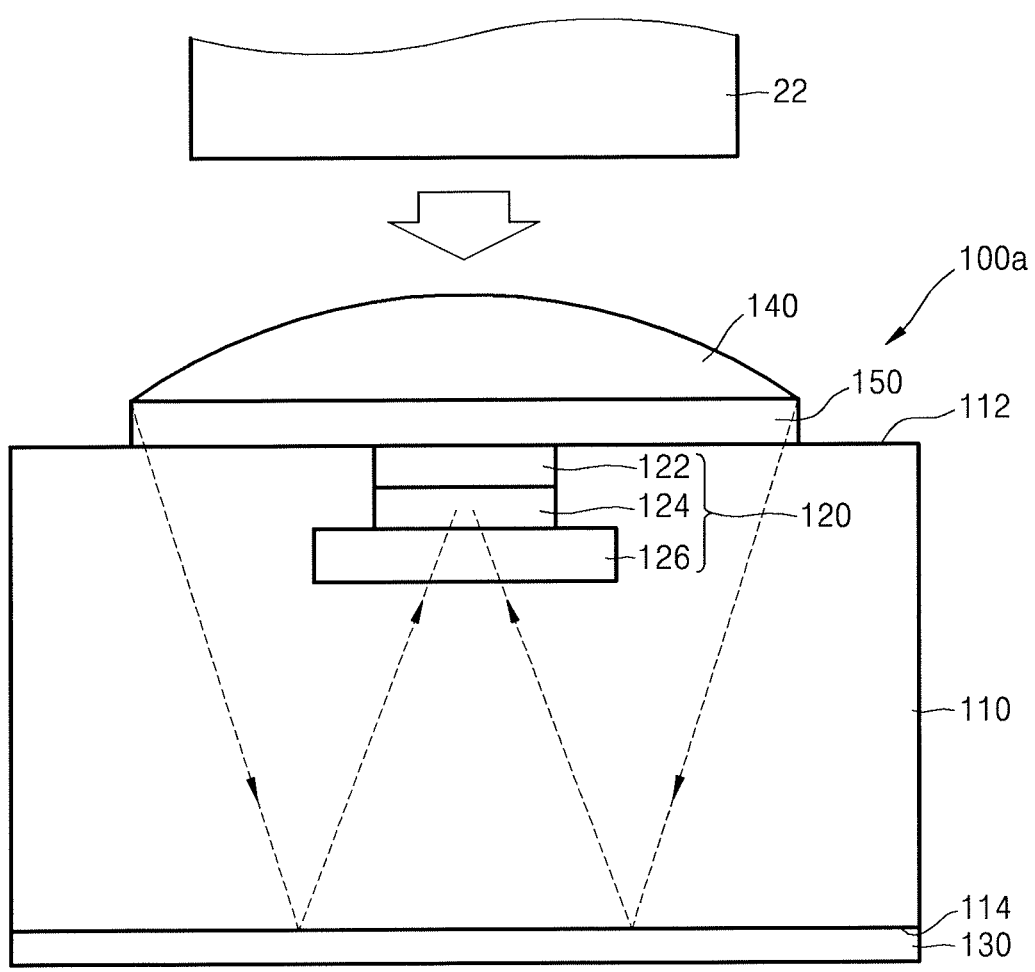
FIG. 3 illustrates a cross-sectional view of part of a photoelectric conversion device according to an example embodiment.

FIG. 3 illustrates a cross-sectional view of part of the photoelectric conversion device 100a according to an example embodiment.

Referring to FIG. 3, the photoelectric conversion device 100a may include a substrate 110, a PD 120, a reflective layer 130, a microlens 140, and an anti-reflection layer 150.

The anti-reflection layer 150 may be formed on a first surface 112 of the substrate 110. The anti-reflection layer 150 may reduce the reflection of light incident to the substrate 110. The anti-reflection layer 150 may have, for example, a roughened surface, a regular pattern or irregular pattern, or a photonic crystal structure. The anti-reflection layer 150 may include, for example, a transparent insulating material. For example, the anti-reflection layer 150 may include at least one of silicon oxide ($SiO_2$), porous $SiO_2$, $KH_2PO_4$ (KDP), $NH_4H_2PO_4$, $CaCO_3$, $BaB_2O_4$, NaF, and $Al_2O_3$. The anti-reflection layer 150 may include a single layer or a multilayered structure. The anti-reflection layer 150 may have, for example, an intermediate refractive index between a refractive index of the substrate 110 of the PD 120 and a refractive index of the microlens 140.

Although FIG. 3 illustrates a case in which the anti-reflection layer 150 has an area corresponding to the area of the microlens 140, the anti-reflection layer 150 may have the same area as or a larger area than the area of the microlens 140. Thus, the anti-reflection layer 150 may be formed between the microlens 140 and the substrate 110. In another implementation, the anti-reflection layer 150 may be formed between the microlens 140 and the substrate 110, as well as on the first surface 112 where the microlens 140 is not formed.

The anti-reflection layer 150 may minimize light, which is reflected by the first surface 112 of the substrate 110 and not incident to the photoelectric conversion device 100, from among light incident from the fiber core 22 to the photoelectric conversion device 100. Thus, the light absorption efficiency of the PD 120 may be improved.

Figure 4:
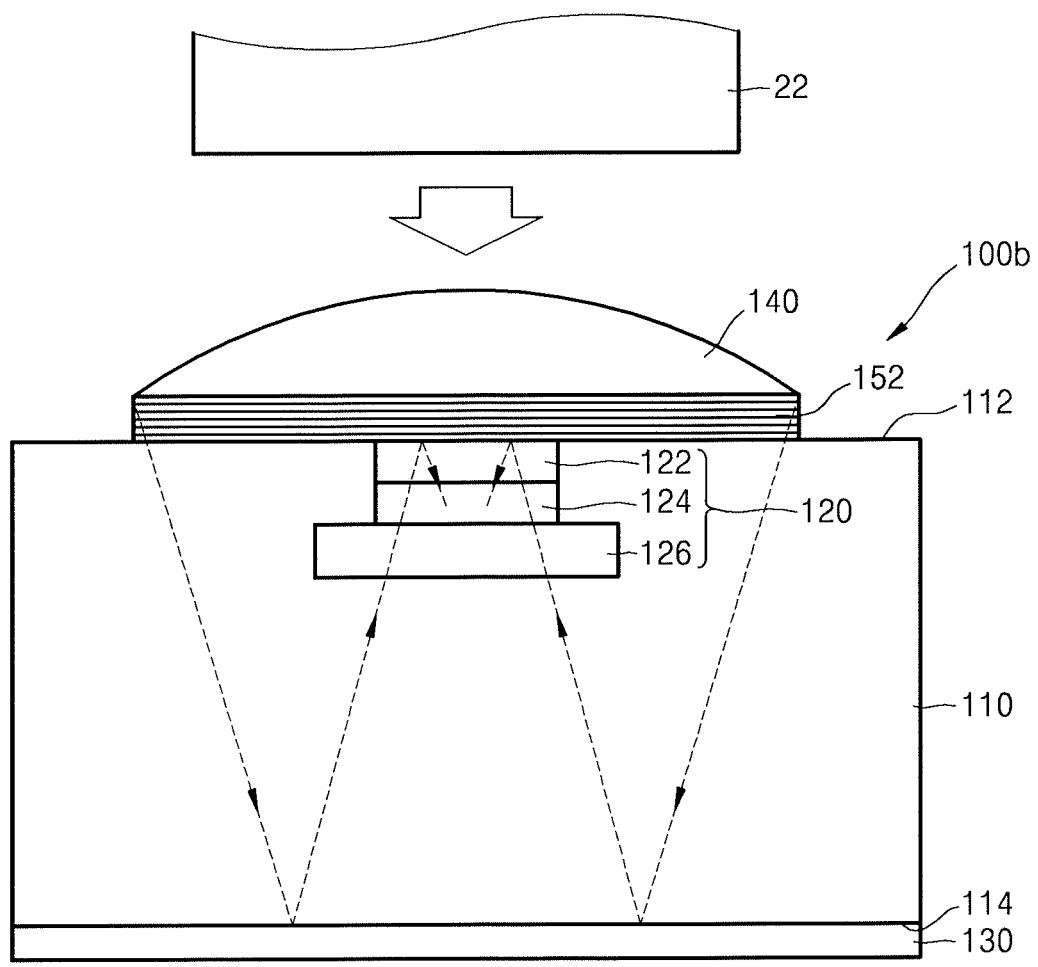
FIG. 4 illustrates a cross-sectional view of part of a photoelectric conversion device according to an example embodiment.

FIG. 4 illustrates a cross-sectional view of part of the photoelectric conversion device 100b according to an example embodiment.

Referring to FIG. 4, the photoelectric conversion device 100b may include a substrate 110, a PD 120, a reflective layer 130, a microlens 140, and an optical isolator layer 152. The optical isolator layer 152 may have, for example, a stack structure in which material layers having different refractive indices are sequentially and repetitively stacked.

The optical isolator layer 152 may function as an anti-reflection layer with respect to light incident to the inside of the substrate 110 from the outside of the substrate 110 and, simultaneously, function as a reflective layer with respect to light emitted from the inside of the substrate 110 to the outside of the substrate 110. Accordingly, light that is not absorbed by the light absorptive semiconductor layer 124 of the PD 120, from among light reflected by the reflective layer 130, may be reflected by the optical isolator layer 152, reach the light absorptive semiconductor layer 124 again, and be absorbed by the light absorptive semiconductor layer 124. Accordingly, the light absorption efficiency of the PD 120 may be improved.

Although FIG. 4 illustrates a case in which the optical isolator layer 152 has an area corresponding to the area of the microlens 140, the optical isolator layer 152 may have the same area as, or a larger area than, the area of the microlens 140. Thus, the optical isolator layer 152 may be formed between the microlens 140 and the substrate 110. In another implementation, the optical isolator layer 152 may be formed between the microlens 140 and the substrate 110 and on the first surface 112 of the substrate 110, on which the microlens 140 is not formed.

The optical isolator layer 152 may minimize light, which is reflected by the first surface 112 of the substrate 110 and not incident to the photoelectric conversion device 100b, from among light incident from the fiber core 22 to the photoelectric conversion device 100b, and prevent light, which is not absorbed by the PD 120, from being emitted out of the substrate 110 through the first surface 112 of the substrate 110. Thus, the light absorption efficiency of the PD 120 may be improved.

Figure 5A:
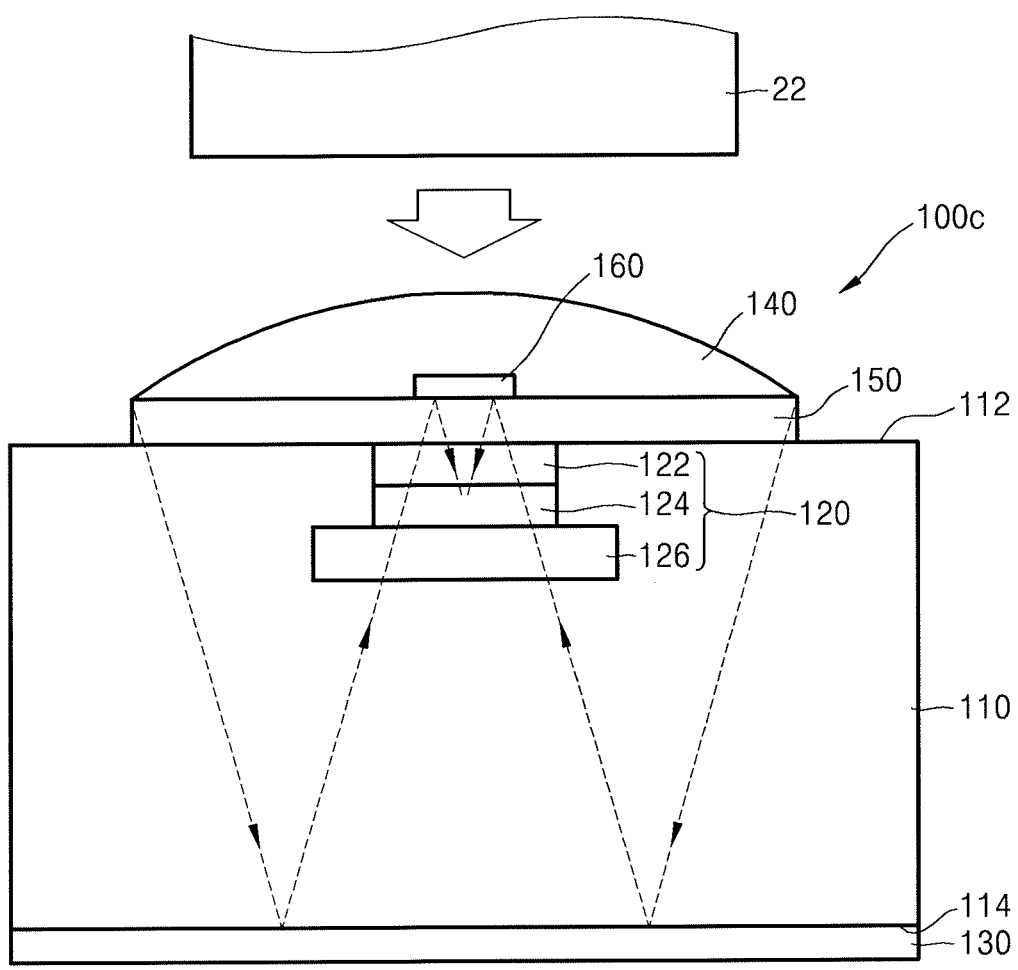
FIG. 5A illustrates a cross-sectional view of part of a photoelectric conversion device according to an example embodiment.

FIG. 5A illustrates a cross-sectional view of part of the photoelectric conversion device 100c according to an example embodiment.

Figure 5B:
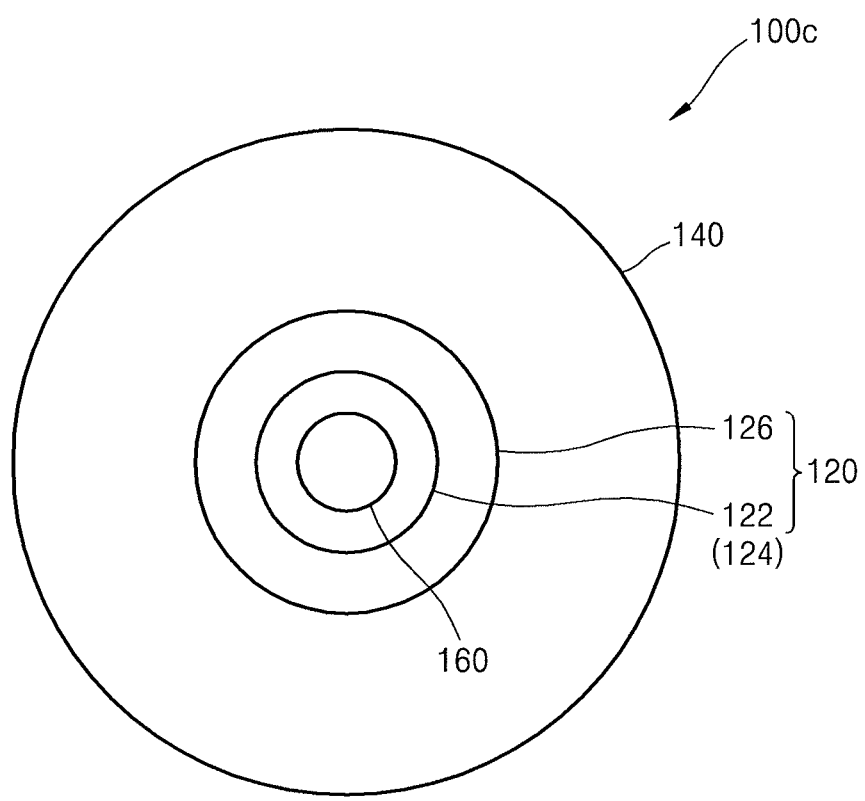
FIG. 5B illustrates a plan view showing the layout of part of a photoelectric conversion device according to an example embodiment, specifically, a plan view showing the layout of a PD, a microlens, and a reflective metal layer in the photoelectric conversion device shown in FIG. 5A.

FIG. 5B illustrates a plan view showing the layout of part of a photoelectric conversion device according to an example embodiment, specifically, a plan view showing the layout of a PD, a microlens, and a reflective metal layer in the photoelectric conversion device 100c shown in FIG. 5A.

Referring to FIGS. 5A and 5B, the photoelectric conversion device 100c may include a substrate 110, a PD 120, a reflective layer 130, a microlens 140, an anti-reflection layer 150, and a reflective metal layer 160.

The anti-reflection layer 150 may be formed on a first surface 112 of the substrate 110. The reflective metal layer 160 may be formed on the first surface 112 of the substrate 110. Although FIG. 5A illustrates a case in which the reflective metal layer 160 is formed between the microlens 140 and the anti-reflection layer 150, the reflective metal layer 160 may be formed between the first surface 112 of the substrate 110 and the anti-reflection layer 150. The reflective metal layer 160 may be a dummy pattern formed along with conductive interconnections, which may be electrically connected to both ends of the PD 120 (i.e., the first conductivity-type semiconductor layer 122 and the second conductivity-type semiconductor layer 126, respectively. In this case, a position of the reflective metal layer 160 may depend on a position of the conductive interconnection.

The reflective metal layer 160 may be formed of, for example, the same material as the conductive interconnection. The reflective metal layer 160 may further include, for example, at least one of aluminum (Al), silver (Ag), an alloy thereof, a silver-based oxide (Ag—O), an APC alloy (an alloy containing Ag, Pd, and Cu), rhodium (Rh), copper (Cu), palladium (Pd), nickel (Ni), ruthenium (Ru), iridium (Ir), and platinum (Pt).

A horizontal area of the reflective metal layer 160 may be less than a horizontal area of the PD 120. The horizontal area of the reflective metal layer 160 may be less than a horizontal area of the light absorptive semiconductor layer 124.

While light is being reflected by the reflective layer 130 and traveling, the beam size of light may be reduced. Light that is not absorbed by the light absorptive semiconductor layer 124, from among light that is reflected by the reflective layer 130 and reaches the light absorptive semiconductor layer 124, may continuously travel toward the first surface 112 of the substrate 110, while the beam size of light is further reduced. The reflective metal layer 160 may be formed to have a horizontal area equal to or larger than the beam size of light that is not absorbed by the light absorptive semiconductor layer 124 but reaches the reflective metal layer 160 after reflection by the reflective layer 130.

Accordingly, light that is not absorbed by the light absorptive semiconductor layer 124 of the PD 120, from among light reflected by the reflective layer 130, may be reflected by the reflective metal layer 160, reaches the light absorptive semiconductor layer 124 again, and be absorbed by the light absorptive semiconductor layer 124. Accordingly, the light absorption efficiency of the PD 120 may be improved.

When the reflective metal layer 160 has an excessively large horizontal area, light incident from the fiber core 22 to the photoelectric conversion device 100c may be reflected by the reflective metal layer 160 and not incident to the photoelectric conversion device 100c. Thus, the reflective metal layer 160 may be formed to have a horizontal area that is less than the horizontal area of the PD 120 or the light absorptive semiconductor layer 124 and minimize light that is not incident to the photoelectric conversion device 100c but reflected.

The horizontal area of the reflective metal layer 160 may be determined in consideration of the amount of light that is reflected by the reflective metal layer 160 and not incident to the photoelectric conversion device 100c, and the amount of light that is not absorbed by the light absorptive semiconductor layer 124 but reaches the reflective metal layer 160 and is reflected again toward the light absorptive semiconductor layer 124.

Figure 6:
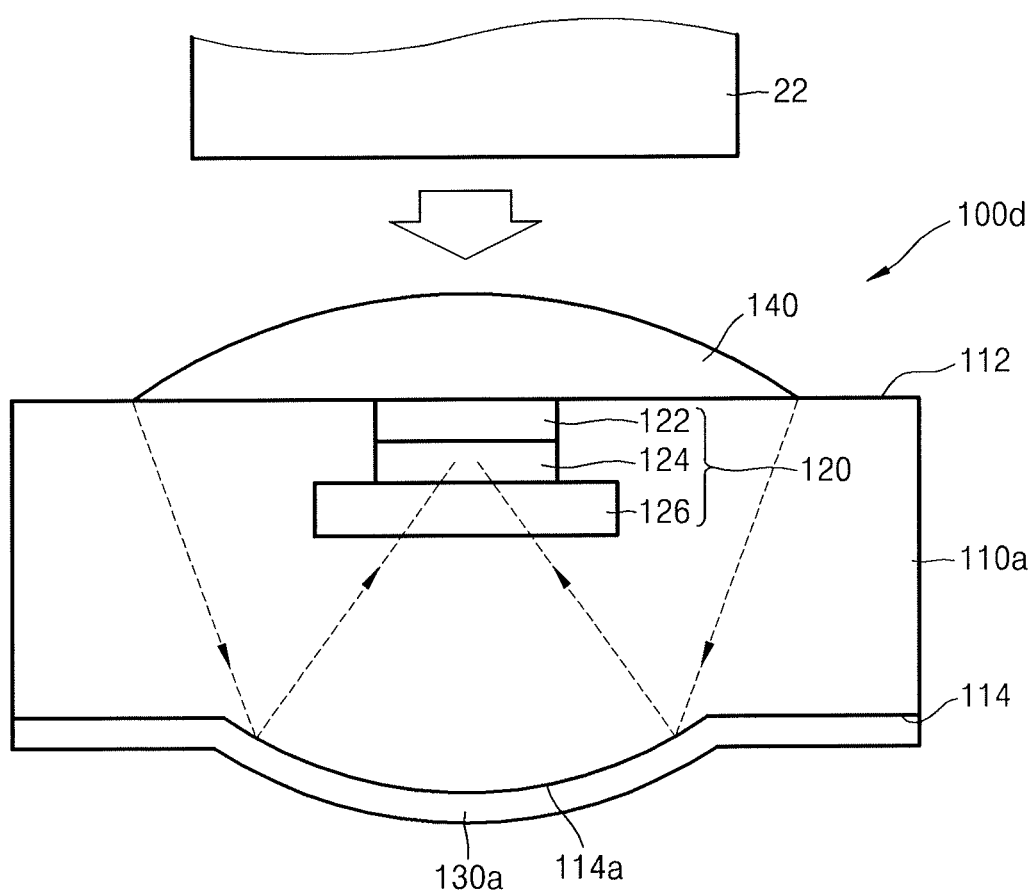
FIG. 6 illustrates a cross-sectional view of part of a photoelectric conversion device according to an example embodiment.

FIG. 6 illustrates a cross-sectional view of part of the photoelectric conversion device 100d according to an example embodiment.

Referring to FIG. 6, the photoelectric conversion device 100d may include a substrate 110a, a PD 120, a reflective layer 130a, and a microlens 140.

A protrusion 114a may be formed on a portion of a second surface 114 of the substrate 110a. The reflective layer 130a may be conformally formed along the second surface 114 on which the protrusion 114a is formed. Accordingly, the reflective layer 130a may have a concave shape toward the PD 120. The concave shape of the reflective layer 130a may be formed at a position in which light incident to the photoelectric conversion device 100d reaches the reflective layer 130a and be formed to a size that is equal to or larger than an area reached by the light. Accordingly, since the concave shape of the reflective layer 130a may serve as a concave lens, after light reaching the reflective layer 130a is reflected by the reflective layer 130a, a beam size of light may be markedly reduced. An optical system including the microlens 140 serving as a convex lens and the reflective layer 130a serving as a concave lens may have a relatively short focal length.

When the substrate 110a has a relatively small thickness, for example, when the semiconductor chip 10 shown in FIG. 1 is further thinned out, most of light reflected by the reflective layer 130a may reach the light absorptive semiconductor layer 124, thereby improving the light absorption efficiency of the PD 120.

Figure 7A:
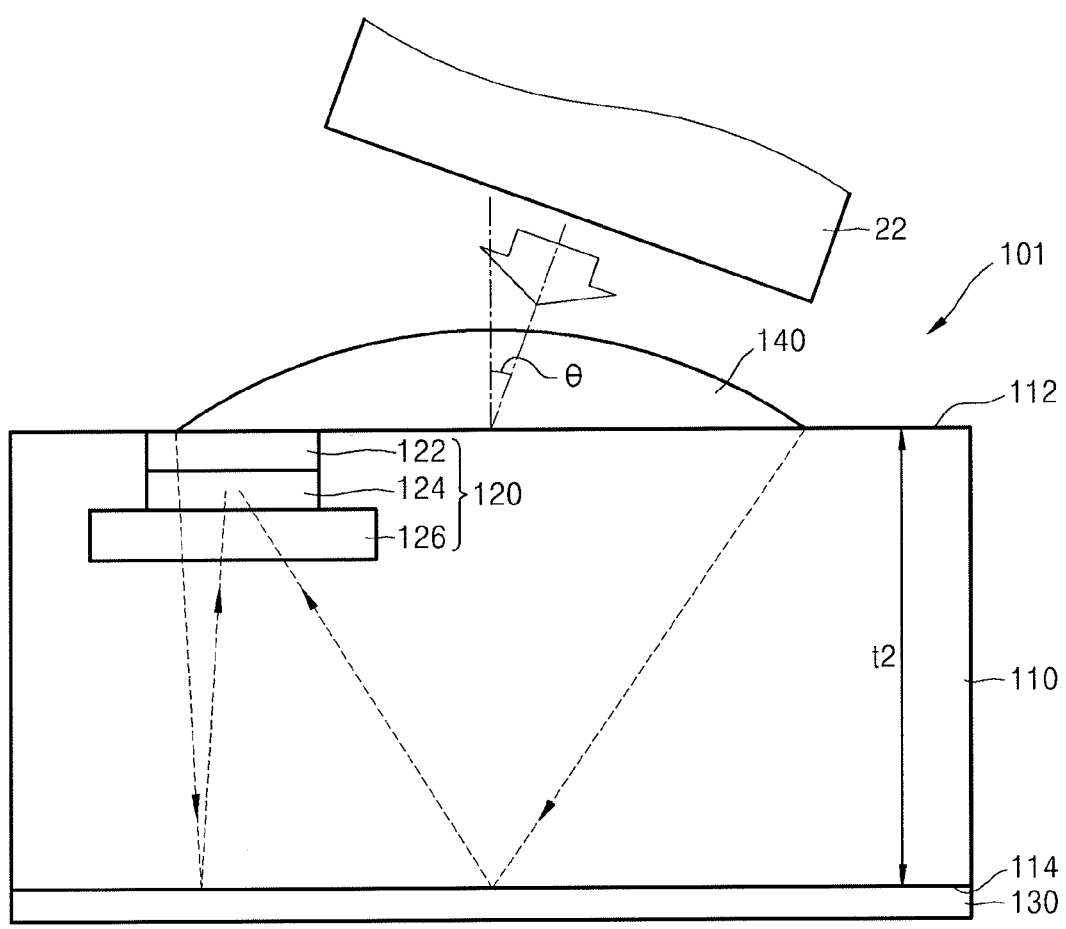
FIG. 7A illustrates a cross-sectional view of part of a photoelectric conversion device according to an example embodiment.

FIG. 7A illustrates a cross-sectional view of part of the photoelectric conversion device 101 according to an example embodiment.

Figure 7B:
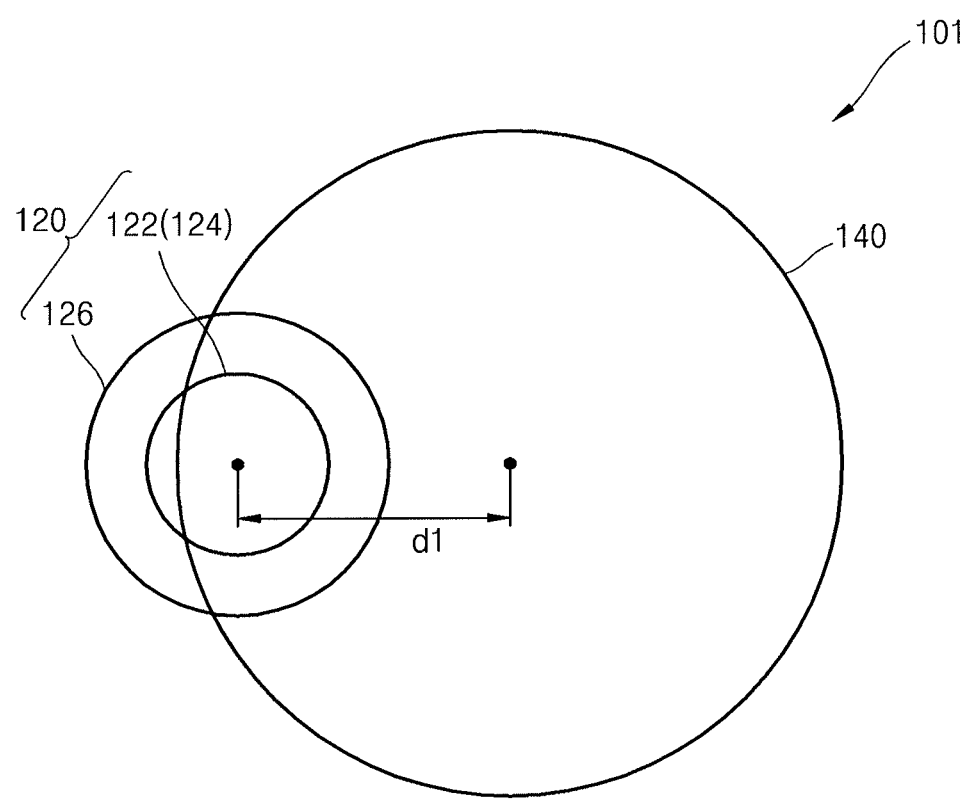
FIG. 7B illustrates a plan view showing the layout of part of a photoelectric conversion device according to an example embodiment, specifically, a plan view showing the layout of a PD and a microlens in the photoelectric conversion device shown in FIG. 7A.

FIG. 7B illustrates a plan view showing the layout of part of a photoelectric conversion device according to an example embodiment, specifically, a plan view showing the layout of a PD 120 and a microlens 140 in the photoelectric conversion device 101 shown in FIG. 7A.

Referring to FIGS. 7A and 7B, the photoelectric conversion device 101 may include a substrate 110, the PD 120, a reflective layer 130, and the microlens 140.

Light incident from a fiber core 22 of an optical fiber included in an optical cable may be incident through the microlens 140 to a first surface 112 of the substrate 110. A direction in which light is incident from the fiber core 22 may have an angle ($\theta$) with respect to a normal line of the first surface 112 of the substrate 110. Thus, a central axis of the optical cable including the fiber core 22 may have the angle $\theta$ with respect to the normal line of the first surface 112 of the substrate 110 and correspond to the microlens 140.

For example, a direction in which light is incident from the fiber core 22 may have an angle of about 3° to about 15° with respect to a normal line of the first surface 112 of the substrate 110. For example, a central axis of the optical cable including the fiber core 22 may have an angle of about 3° to about 15° with respect to the normal line of the first surface 112 of the substrate 110, and correspond to the microlens 140.

When a direction in which light is incident from the fiber core 22 has an angle $\theta$ with respect to the normal line of the first surface 112 of the substrate 110, a center of the microlens 140 may be offset far from a center of a light absorptive semiconductor layer 124, i.e., offset from the center of the light absorptive semiconductor layer 124, in a horizontal direction with respect to the first surface 112 of the substrate 110.

A distance d1 by which the center of the microlens 140 is offset from the center of the light absorptive semiconductor layer 124 may be, for example, $2 \times t2 \times \tan \theta$. Herein, t2 may be a thickness of the substrate 110. In consideration of a thickness of the PD 120, a DOF of the microlens 140, a thickness of a transparent insulating layer that may be formed between the PD 120 and the microlens 140, and process tolerances, the distance d1 by which the center of the microlens 140 is offset from the center of the light absorptive semiconductor layer 124 may be determined with a range of $2 \times t2 \times \tan \theta \pm 5\%$.

At least a portion of the light absorptive semiconductor layer 124 may not overlap the microlens 140 according to the distance d1 by which the center of the microlens 140 is offset from the center of the light absorptive semiconductor layer 124. in a vertical direction to the first surface 112 of the substrate 110. Similarly, at least a portion of each of a first conductivity-type semiconductor layer 122 and a second conductivity-type semiconductor layer 126 may not overlap the microlens 140 in the vertical direction to the first surface 112 of the substrate 110. Conductive interconnections respectively electrically connected to the first conductivity-type semiconductor layer 122 and the second conductivity-type semiconductor layer 126 may extend far from the PD 120 on portions of the first conductivity-type semiconductor layer 122 and the second conductivity-type semiconductor layer 126, which do not overlap the microlens 140.

Accordingly, light incident through the microlens 140 to the photoelectric conversion device 101 may be prevented from being absorbed or reflected due to conductive interconnections respectively electrically connected to the first conductivity-type semiconductor layer 122 and the second conductivity-type semiconductor layer 126, thereby improving the light absorption efficiency of the PD 120.

The thickness t2 of the substrate 110 may be FL×cos θ/2. Herein, FL may be a focal length of the microlens 140. In consideration of a thickness of the PD 120, a DOF of the microlens 140, a thickness of a transparent insulating layer that may be formed between the PD 120 and the microlens 140, and process tolerances, the thickness t2 of the substrate 110 may be determined within a range of FL×cos θ/2±5%.

Figure 8:
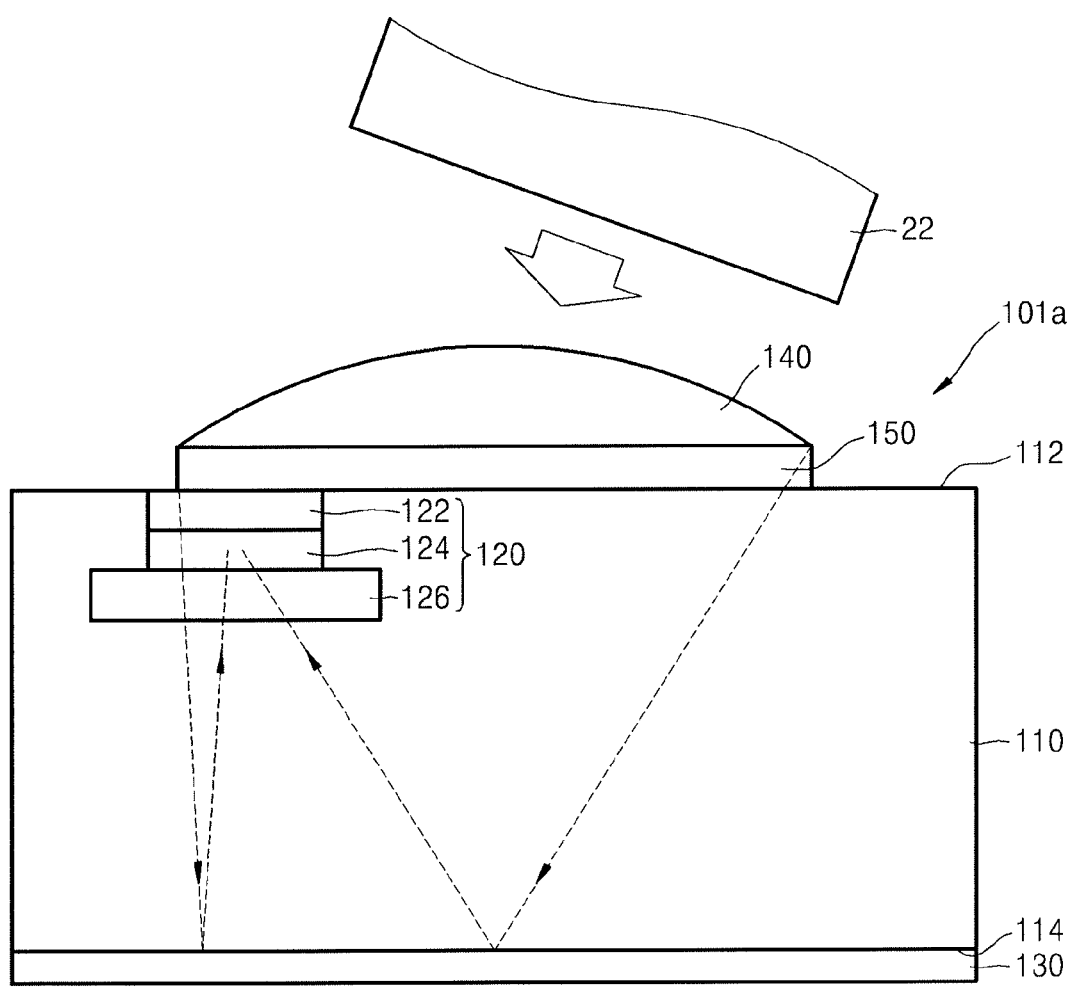
FIG. 8 illustrates a cross-sectional view of part of a photoelectric conversion device according to an example embodiment.

FIG. 8 illustrates a cross-sectional view of part of the photoelectric conversion device 101a according to an example embodiment.

Referring to FIG. 8, the photoelectric conversion device 101a may include a substrate 110, a PD 120, a reflective layer 130, a microlens 140, and an anti-reflection layer 150. The anti-reflection layer 150 may be formed on a first surface 112 of the substrate 110. The anti-reflection layer 150 may function to reduce the reflection of light incident to the substrate 110.

The anti-reflection layer 150 may be formed between the microlens 140 and the substrate 110. Accordingly, the anti-reflection layer 150 may not overlap the PD 120 (particular, at least a portion of the light absorptive semiconductor layer 124) in a vertical direction to the first surface 112 of the substrate 110. Accordingly, since part of light, which is not absorbed by the light absorptive semiconductor layer 124 but reaches the first surface 112 of the substrate 110, does not reach the anti-reflection layer 150, the amount of light emitted out of the substrate 110 may be minimized, thereby improving the light absorption efficiency of the PD 120.

Figure 9:
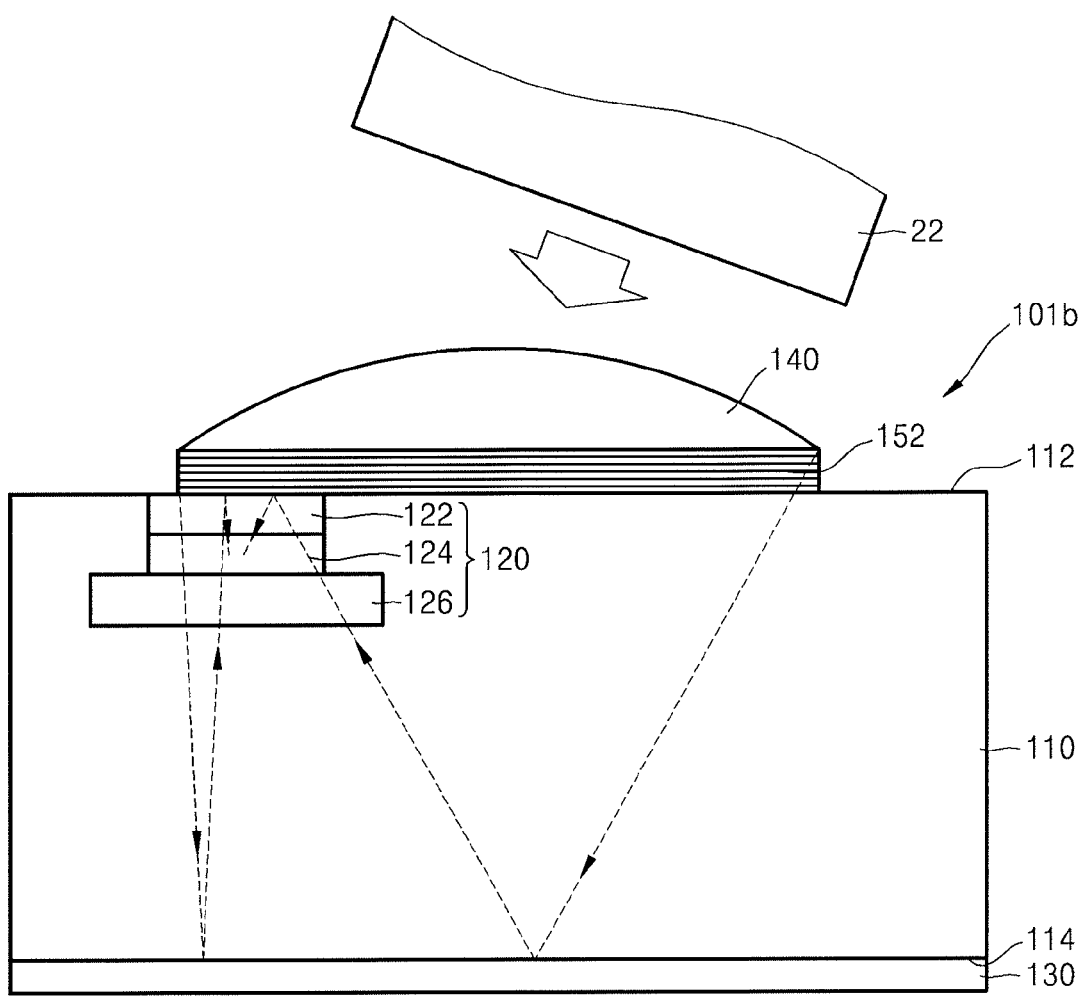
FIG. 9 illustrates a cross-sectional view of part of a photoelectric conversion device according to an example embodiment.

FIG. 9 illustrates a cross-sectional view of part of a photoelectric conversion device 101b according to an example embodiment.

Referring to FIG. 9, the photoelectric conversion device 101b may include a substrate 110, a PD 120, a reflective layer 130, a microlens 140, and an optical isolator layer 152.

The optical isolator layer 152 may function as an anti-reflection layer with respect to light incident to the inside of the substrate 110 from the outside of the substrate 110 and simultaneously, function as a reflective layer with respect to light emitted from the inside of the substrate 110 to the outside of the substrate 110.

Accordingly, light that is not absorbed by the light absorptive semiconductor layer 124 of the PD 120, from among light reflected by the reflective layer 130, may be reflected by the optical isolator layer 152, reach the light absorptive semiconductor layer 124 again, and be absorbed by the light absorptive semiconductor layer 124. Accordingly, the light absorption efficiency of the PD 120 may be improved.

Although FIG. 9 illustrates a case in which the optical isolator layer 152 has an area corresponding to the area of the microlens 140, the optical isolator layer 152 may have the same area as or a larger area than the area of the microlens 140. Thus, the optical isolator layer 152 may be formed between the microlens 140 and the substrate 110. In another implementation, the optical isolator layer 152 may be formed between the microlens 140 and the substrate 110 and on the first surface 112 of the substrate 110, on which the microlens 140 is not formed.

The optical isolator layer 152 may minimize light, which is reflected by the first surface 112 of the substrate 110 and not incident to the photoelectric conversion device 101b, from among light incident from the fiber core 22 to the photoelectric conversion device 101b, and prevent light, which is not absorbed by the PD 120, from being emitted out of the substrate 110 through the first surface 112 of the substrate 110. Thus, the light absorption efficiency of the PD 120 may be improved.

Figure 10A:
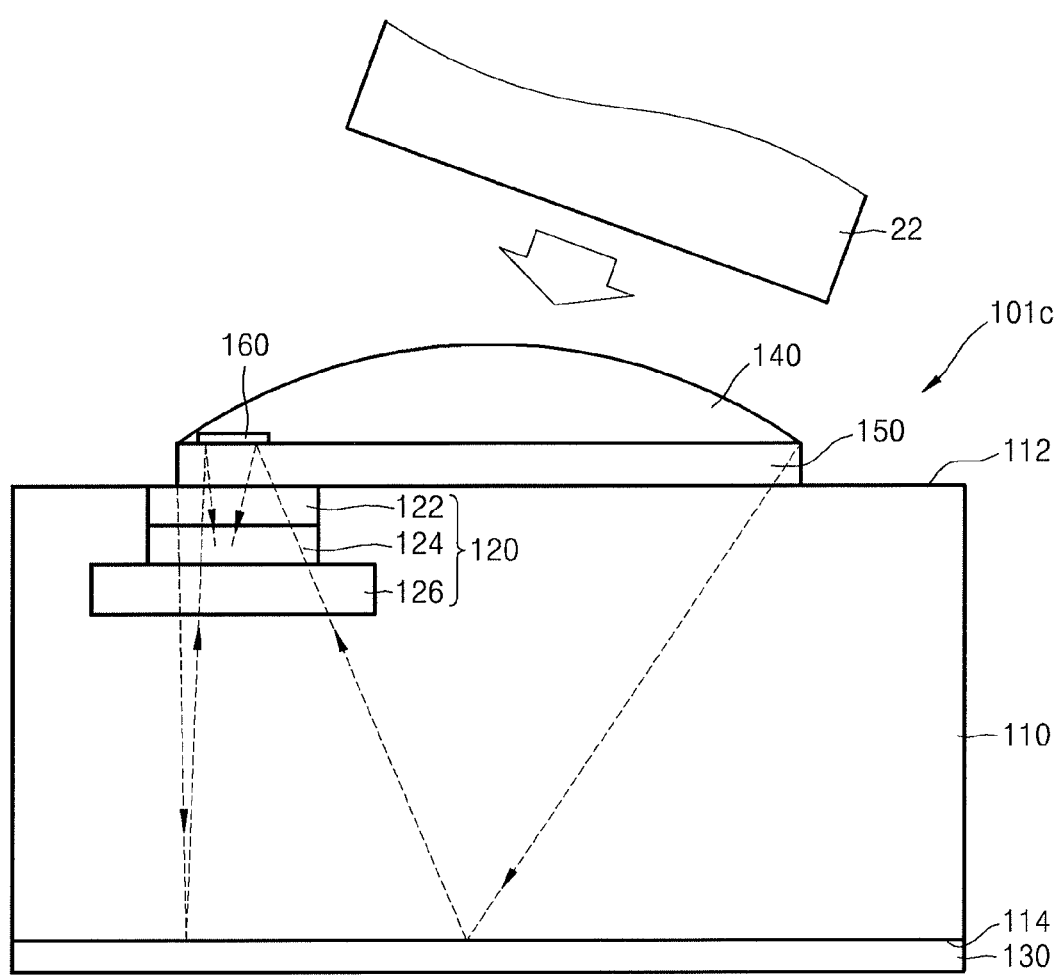
FIG. 10A illustrates a cross-sectional view of part of a photoelectric conversion device according to an example embodiment.

FIG. 10A illustrates a cross-sectional view of part of the photoelectric conversion device 101c according to an example embodiment.

Figure 10B:
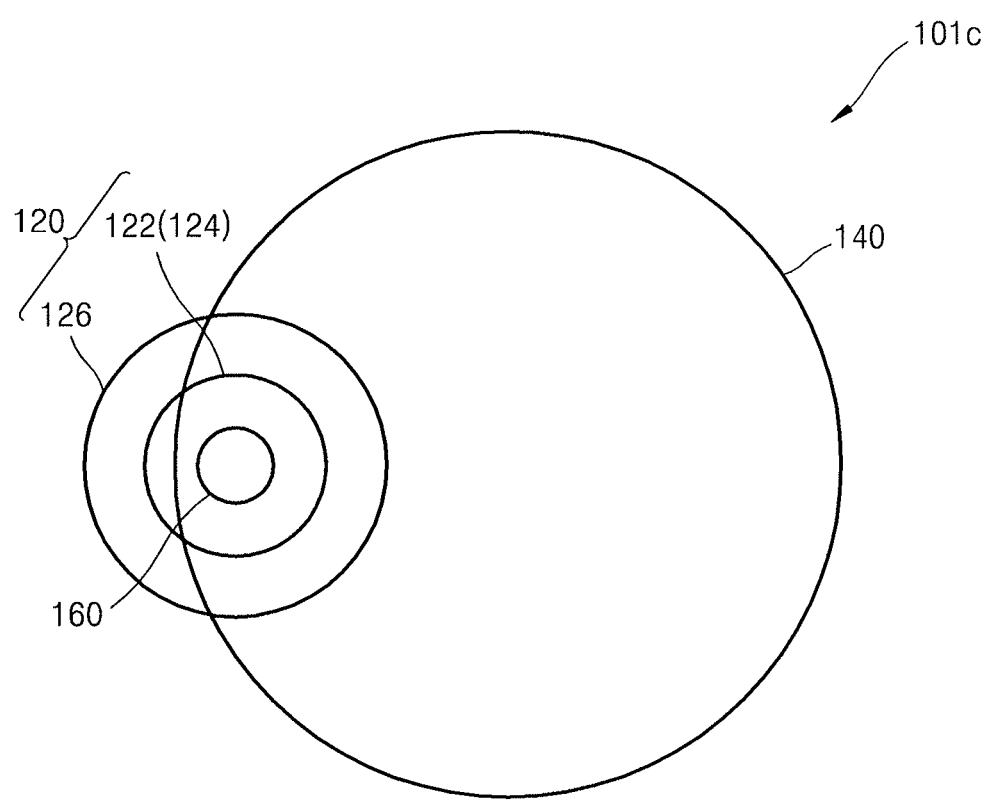
FIG. 10B illustrates a plan view showing the layout of a PD, a microlens, and a reflective metal layer in the photoelectric conversion device shown in FIG. 10A.

FIG. 10B illustrates a plan view showing the layout of part of a photoelectric conversion device according to an example embodiment, specifically, a plan view showing the layout of a PD 120, a microlens 140, and a reflective metal layer 160 in the photoelectric conversion device 101c shown in FIG. 10A.

Referring to FIGS. 10A and 10B, the photoelectric conversion device 101c may include a substrate 110, the PD 120, a reflective layer 130, the microlens 140, an anti-reflection layer 150, and the reflective metal layer 160.

The anti-reflection layer 150 may be formed on a first surface 112 of the substrate 110. The reflective metal layer 160 may be formed on the first surface 112 of the substrate 110.

A horizontal area of the reflective metal layer 160 may be less than a horizontal area of the PD 120. The horizontal area of the reflective metal layer 160 may be less than a horizontal area of a light absorptive semiconductor layer 124.

Light that is not absorbed by the light absorptive semiconductor layer 124 of the PD 120, from among light reflected by the reflective layer 130, may be reflected by the reflective metal layer 160, reach the light absorptive semiconductor layer 124 again, and be absorbed by the light absorptive semiconductor layer 124. Accordingly, the light absorption efficiency of the PD 120 may be improved.

Figure 11:
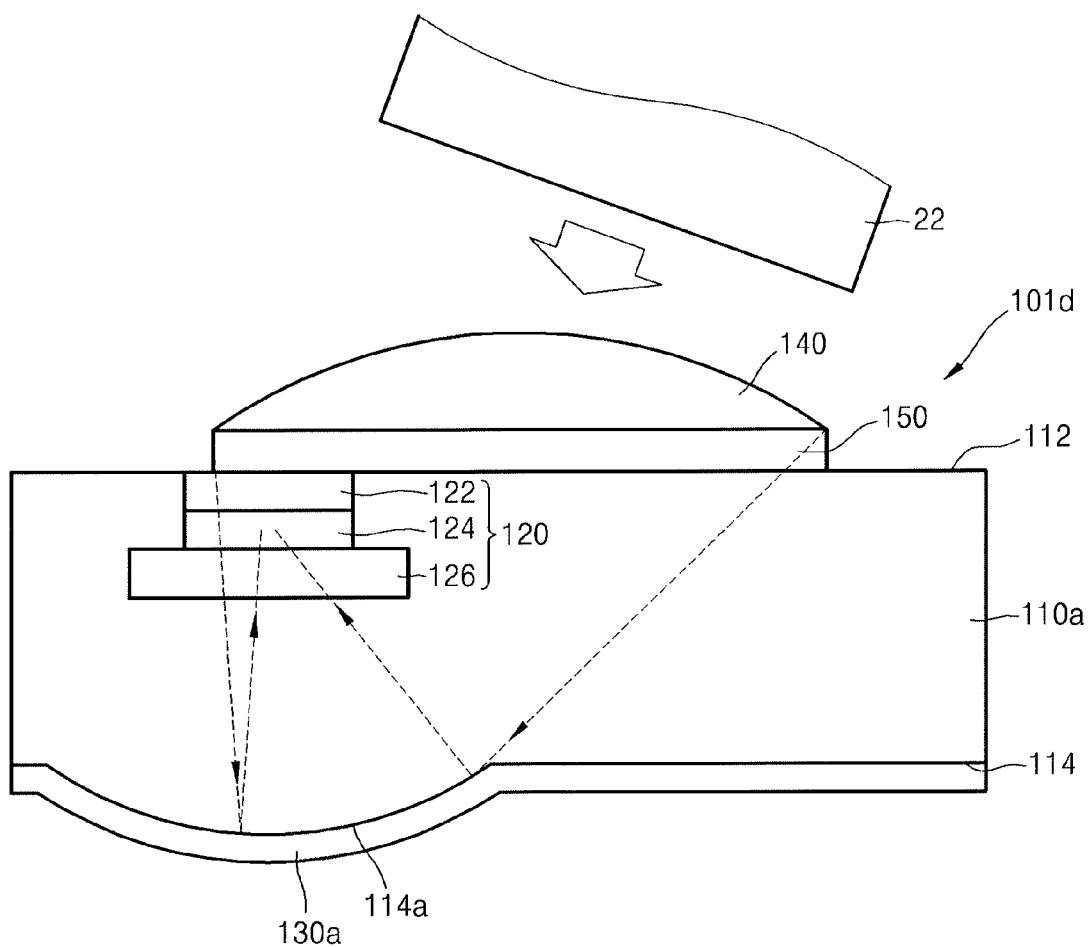
FIG. 11 illustrates a cross-sectional view of part of a photoelectric conversion device according to an example embodiment.

FIG. 11 illustrates a cross-sectional view of part of the photoelectric conversion device 101d according to an example embodiment.

Referring to FIG. 11, the photoelectric conversion device 101d may include a substrate 110a, a PD 120, a reflective layer 130a, and a microlens 140.

A protrusion 114a may be formed on a portion of a second surface 114 of the substrate 110a. The reflective layer 130a may be conformally formed along the second surface 114 on which the protrusion 114a is formed. Accordingly, the reflective layer 130a may have a concave shape toward the PD 120. Since the concave shape of the reflective layer 130a may serve as a concave lens, after light reaching the reflective layer 130a is reflected by the reflective layer 130a, a beam size of light may be markedly reduced. An optical system including the microlens 140 serving as a convex lens and the reflective layer 130a serving as a concave lens may have a relatively short focal length.

When the substrate 110a has a relatively small thickness, for example, when the semiconductor chip 10 shown in FIG. 1 is further thinned out, most of light reflected by the reflective layer 130a may reach the light absorptive semiconductor layer 124, thereby improving the light absorption efficiency of the PD 120.

Figure 12:
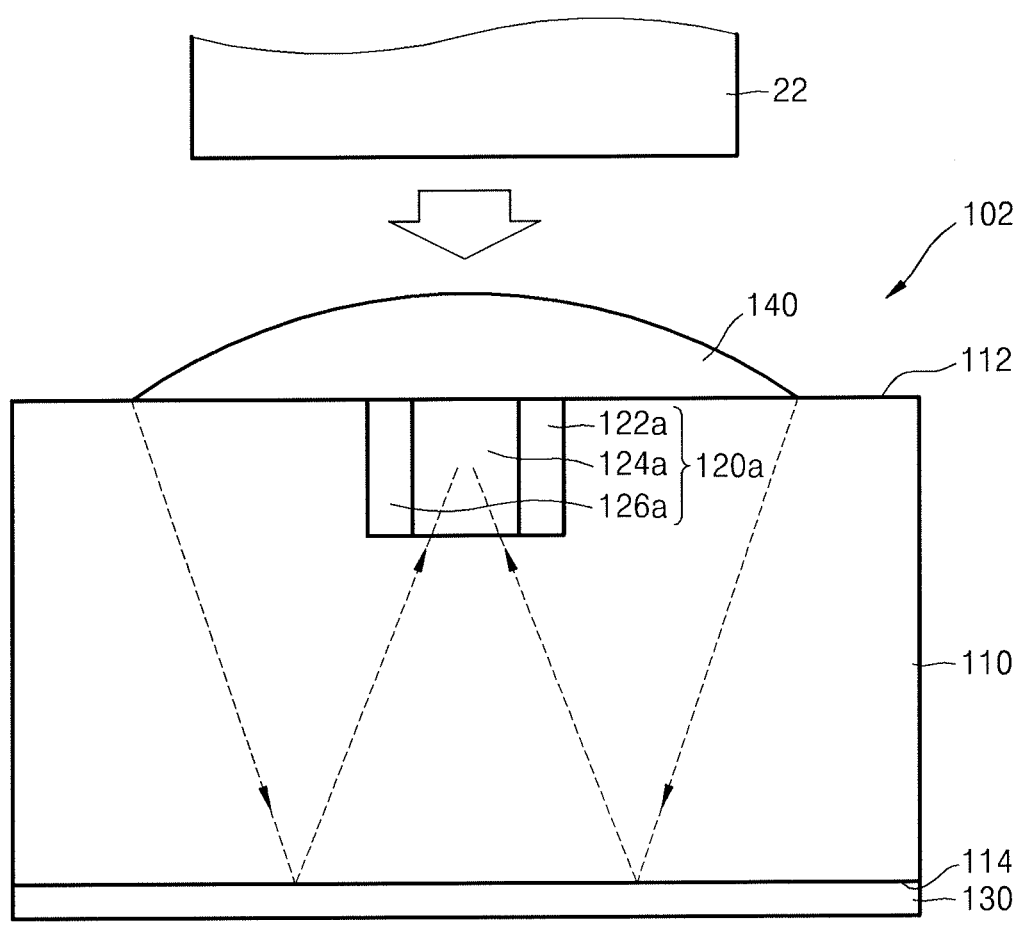
FIG. 12 illustrates a cross-sectional view of part of a photoelectric conversion device according to an example embodiment.

FIG. 12 illustrates a cross-sectional view of part of the photoelectric conversion device 102 according to an example embodiment.

Referring to FIG. 12, the photoelectric conversion device 102 may include a substrate 110, a PD 120a, a reflective layer 130, and a microlens 140.

A direction in which light is incident from a fiber core 22 to the photoelectric conversion device 102 may be a vertical direction to a first surface 112 of the substrate 110.

The PD 120a may include a PIN diode including a first conductivity-type semiconductor layer 122a, a light absorptive semiconductor layer 124a, and a second conductivity-type semiconductor layer 126a. The light absorptive semiconductor layer 124a may be interposed between the first conductivity-type semiconductor layer 122a and the second conductivity-type semiconductor layer 126a. The first conductivity-type semiconductor layer 122a, the light absorptive semiconductor layer 124a, and the second conductivity-type semiconductor layer 126a may be arranged in a direction parallel to the first surface 112 of the substrate 110.

FIG. 12 illustrates a case in which one light absorptive semiconductor layer 124a is disposed between one first conductivity-type semiconductor layer 122a and one second conductivity-type semiconductor layer 126a, but embodiments is not limited thereto. For example, the PD 120a may include a plurality of light absorptive semiconductor layers 124a respectively disposed between a plurality of first-conductive-type semiconductor layers 122a and a plurality of second conductivity-type semiconductor layers 126a that are alternately disposed.

Figure 13:
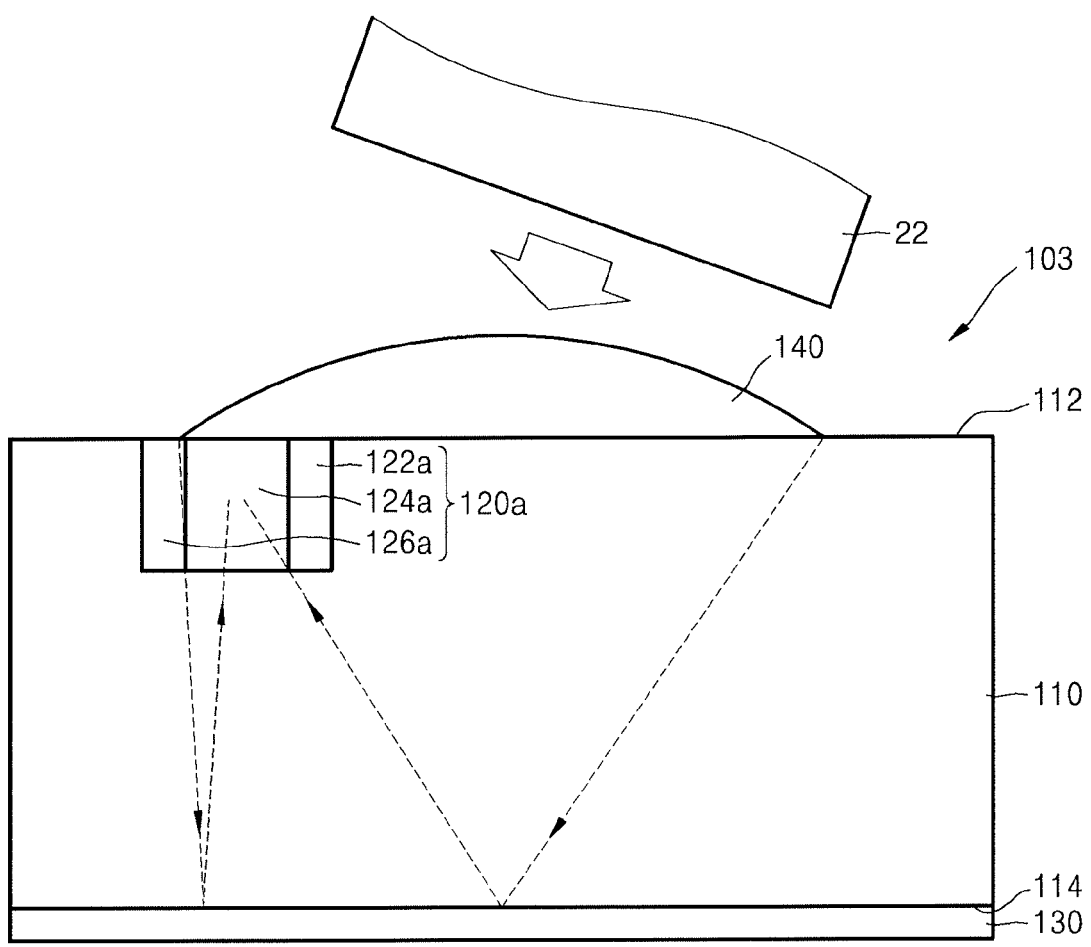
FIG. 13 illustrates a cross-sectional view of part of a photoelectric conversion device according to an example embodiment.

FIG. 13 illustrates a cross-sectional view of part of the photoelectric conversion device 103 according to an example embodiment.

Referring to FIG. 13, the photoelectric conversion device 103 may include a substrate 110, a PD 120a, a reflective layer 130, and a microlens 140.

A direction in which light is incident from a fiber core 22 to the photoelectric conversion device 103 may have an angle θ with respect to a normal line of a first surface 112 of the substrate 110. Thus, a central axis of an optical cable including the fiber core 22 may have an angle θ with respect to the normal line of the first surface 112 of the substrate 110 and correspond to the microlens 140.

The PD 120a may be a PIN diode including a first conductivity-type semiconductor layer 122a, a light absorptive semiconductor layer 124a, and a second conductivity-type semiconductor layer 126a. The light absorptive semiconductor layer 124a may be interposed between the first conductivity-type semiconductor layer 122a and the second conductivity-type semiconductor layer 126a. The first conductivity-type semiconductor layer 122a, the light absorptive semiconductor layer 124a, and the second conductivity-type semiconductor layer 126a may be arranged in a direction parallel to the first surface 112 of the substrate 110.

Although not additionally shown, the photoelectric conversion devices 102 and 103 shown in FIGS. 12 and 13 may further include the anti-reflection layer 150 shown in FIGS. 3 and 8, the optical isolator layer 152 shown in FIGS. 4 and 9, and the anti-reflection layer 150 and the reflective metal layer 160 shown in FIGS. 5A, 5B, 10A, and 10B. Furthermore, the reflective layer 130 of the photoelectric conversion devices 102 and 103 shown in FIGS. 12 and 13 may be replaced by the reflective layer 130a having a concave shape shown in FIGS. 6 and 11.

A PD 120 of each of the photoelectric conversion devices 104, 104a, 104b, 105, 105a, 106, and 106a shown in FIGS. 14A through 20 may be also replaced by the PD 120a shown in FIGS. 12 and 13.

Figure 14A:
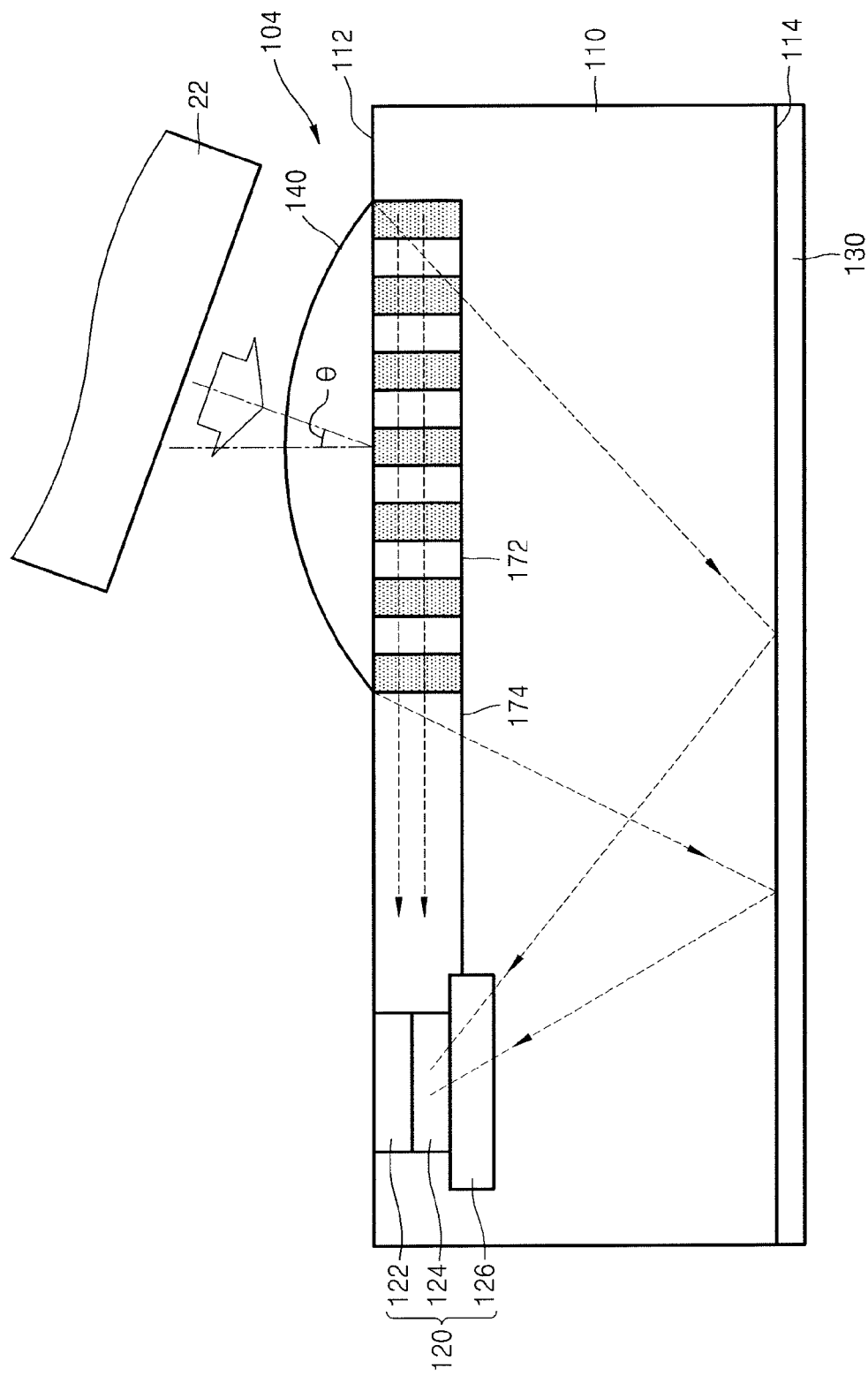
FIG. 14A illustrates a cross-sectional view of part of a photoelectric conversion device according to an example embodiment.

FIG. 14A illustrates a cross-sectional view of part of the photoelectric conversion device 104 according to an example embodiment.

FIG. 14B illustrates a plan view showing the layout of part a photoelectric conversion device according to an example embodiment, specifically, a plan view showing the layout of a PD 120 and a microlens 140 in the photoelectric conversion device 104 shown in FIG. 14A.

Referring to FIGS. 14A and 14B, the photoelectric conversion device 104 may include a substrate 110, the PD 120, a reflective layer 130, the microlens 140, a lattice coupler 172, and a waveguide 174. The microlens 140 may be formed on the lattice coupler 172.

A direction in which light is incident from a fiber core 22 to the photoelectric conversion device 104 may have an angle θ with respect to a normal line of a first surface 112 of the substrate 110. Thus, a central axis of an optical cable including the fiber core 22 may have an angle θ with respect to the normal line of the first surface 112 of the substrate 110 and correspond to the microlens 140.

The lattice coupler 172 and the waveguide 174 may be formed in the first surface 112 of the substrate 110. The lattice coupler 172 may include a series of lines that are approximately parallel to one another, such as lines isolated by grooves. The lattice coupler 172 may be formed of a material having a higher refractive index than the substrate 110. In this case, the substrate 110 may serve as a lower cladding layer for the lattice coupler 172. The lattice coupler 172 may be formed of, for example, an elemental semiconductor, such as silicon (Si) or germanium (Ge), or a compound semiconductor, such as a Group III-V compound semiconductor or a Group II-VI compound semiconductor. In another implementation, the lattice coupler 172 may be formed of, for example, a non-semiconductor material or a polymer.

For example, the formation of the lattice coupler 172 may be performed using various lithography techniques and/or etching techniques, such as a nano-imprint lithography process or a reactive ion etching (RIE) process, to form grooves between the lines.

The waveguide 174 may be, for example, a ridge waveguide or a strip-loaded waveguide.

A direction in which light incident through the microlens 140 travels may be changed by the lattice coupler 172 such that the light travels in a direction parallel to the first surface 112 of the substrate 110, and the waveguide 174 may transmit the light to the PD 120 in the changed direction.

Since the photoelectric conversion device 104 transmits light, which is incident through the microlens 140, to the PD 120 by using the lattice coupler 172 and the waveguide 174, a distance d2 by which a center of the microlens 140 is offset from a center of the light absorptive semiconductor layer 124 may be larger than when the lattice coupler 172 and the waveguide 174 are not formed.

The reflective layer 130 may reflect light, which neither travels in the direction changed by the lattice couple 172 nor travels in the direction parallel to the first surface 112 of the substrate 110 but reaches the second surface 114 of the substrate 110, toward the PD 120.

In the photoelectric conversion device 104, incident light may be transmitted by the lattice coupler 172 and the waveguide 172 to the PD 120 in the direction parallel to the first surface 112 of the substrate 110. Thus, optical loss due to absorption of light may be minimized in the substrate 110. Also, light that neither travels in the direction changed by the lattice couple 172 nor travels in the direction parallel to the first surface 112 of the substrate 110 but reaches the second surface 114 of the substrate 110 may be reflected toward the PD 120, thereby improving the light absorption efficiency of the photoelectric conversion device 104.

FIG. 15A illustrates a cross-sectional view of part of a photoelectric conversion device 104a according to an example embodiment.

Figure 15B:
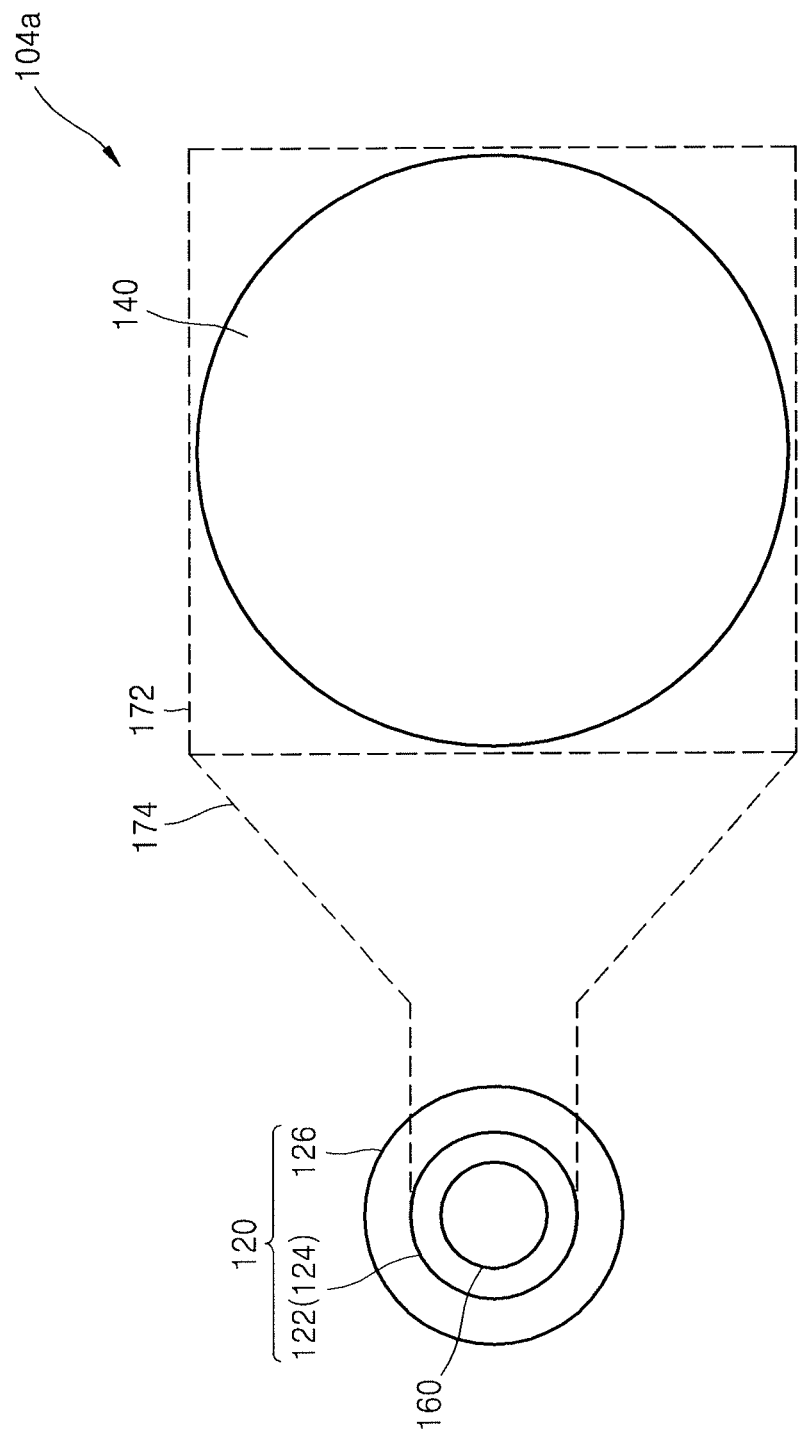
FIG. 15B illustrates a plan view showing the layout of a PD, a microlens, and a reflective metal layer in the photoelectric conversion device shown in FIG. 15A.

FIG. 15B illustrates a plan view showing the layout part of a photoelectric conversion device according to an example embodiment, specifically, a plan view showing the layout of a PD 120, a microlens 140, and the reflective metal layer 160 in the photoelectric conversion device 104a shown in FIG. 15A.

Referring to FIGS. 15A and 15B, the photoelectric conversion device 104a may include a substrate 110, the PD 120, a reflective layer 130, the microlens 140, an anti-reflection layer 150, the reflective metal layer 160, a lattice coupler 172, and a waveguide 174.

The anti-reflection layer 150 may be formed on a first surface 112 of the substrate 110. Although FIG. 15A illustrates a case in which the anti-reflection layer 150 has an area corresponding to the area of the microlens 140, the anti-reflection layer 150 may have the same area as or a larger area than the area of the microlens 140. Thus, the anti-reflection layer 150 may be formed between the microlens 140 and the substrate 110. In another implementation, the anti-reflection layer 150 may be formed between the microlens 140 and the substrate 110 and on the first surface 112 of the substrate 110, on which the microlens 140 is not formed.

The reflective metal layer 160 may be formed on the first surface 112 of the substrate 110. In an implementation, a horizontal area of the reflective metal layer 160 may be less than a horizontal area of the PD 120. The photoelectric conversion device 104a may include the lattice coupler 172 and the waveguide 174, and the microlens 140 may be formed on the lattice coupler 172. Thus, a position at which light is incident to the substrate 110 may be spaced apart from a position at which the PD 120 is formed. Thus, when the reflective metal layer 160 is formed on the PD 120, light that is not incident to the substrate 110 but reflected by the reflective metal layer 160 may not be generated.

Accordingly, the amount of light incident to the substrate 110 may be increased by the anti-reflection layer 150, and light that is not incident to the substrate 110 but reflected by the reflective metal layer 160 is not generated by the reflective metal layer 160. Thus, light absorption efficiency may be improved.

Figure 16:
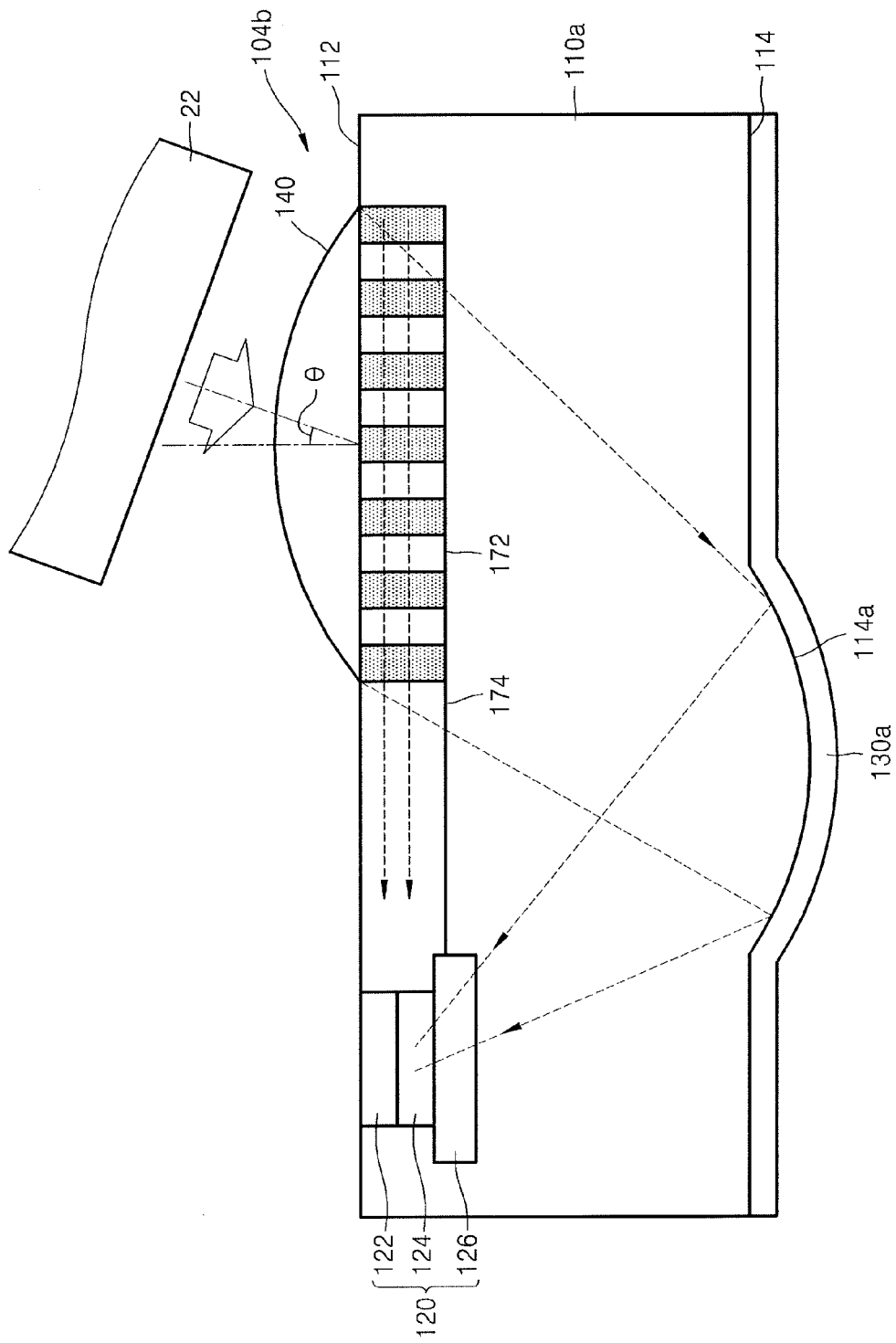
FIG. 16 illustrates a cross-sectional view of part of a photoelectric conversion device according to an example embodiment.

FIG. 16 illustrates a cross-sectional view of part of the photoelectric conversion device 104b according to an example embodiment.

Referring to FIG. 16, the photoelectric conversion device 104b may include a substrate 110a, a PD 120, a reflective layer 130a, a microlens 140, an anti-reflection layer 150, a reflective metal layer 160, a lattice coupler 172, and a waveguide 174.

A direction in which light is incident from a fiber core 22 to the photoelectric conversion device 104b may be a vertical direction to a second surface 114 of the substrate 110.

A protrusion 114a may be formed on a portion of the second surface 114 of the substrate 110a. The reflective layer 130a may have a concave shape toward the PD 120. Since the concave shape of the reflective layer 130a may serve as a concave lens, after light reaching the reflective layer 130a is reflected by the reflective layer 130a, a beam size of light may be markedly reduced. An optical system including the microlens 140 serving as a convex lens and the reflective layer 130a serving as a concave lens may have a relatively short focal length.

When the substrate 110a has a relatively small thickness, for example, when the semiconductor chip 10 shown in FIG. 1 is further thinned out, most of light reflected by the reflective layer 130a may reach the light absorptive semiconductor layer 124, thereby improving the light absorption efficiency of the PD 120.

Figure 17:
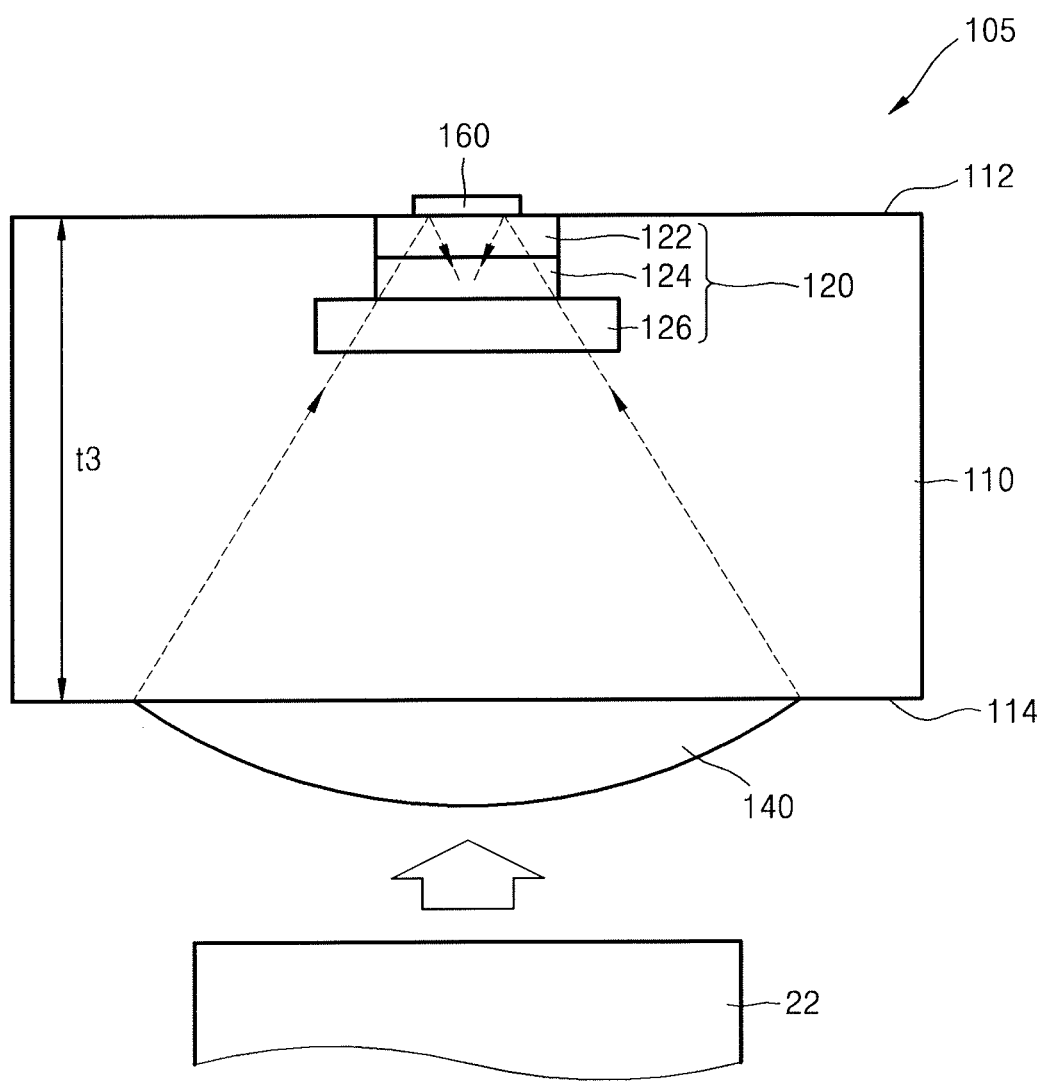
FIG. 17 illustrates a cross-sectional view of part of a photoelectric conversion device according to an example embodiment.

FIG. 17 illustrates a cross-sectional view of part of the photoelectric conversion device 105 according to an example embodiment.

Referring to FIG. 17, the photoelectric conversion device 105 may include a substrate 110, a PD 120, a microlens 140, and a reflective metal layer 160.

The substrate 110 may have a first surface 112 and a second surface 114 that is the opposite side of the first surface 112, and the PD 120 may be formed on the first surface 112 of the substrate 110.

The microlens 140 may be formed on the second surface 114 of the substrate 110, and the reflective metal layer 160 may be formed on the first surface 112 of the substrate 110. The second surface 114 of the substrate 110 may be a light incidence surface.

When the microlens 140 is a convex lens, a beam size of light passing through the microlens 140 may be gradually reduced while the light is traveling through the photoelectric conversion device 105. When a thickness and areas of the PD 120 are less than a thickness t3 of the substrate 110, the thickness t3 of the substrate 110 may be about equal to a focal length FL of the microlens 140. In this case, most of light reflected by the reflective layer 130 may reach the PD 120, particularly, the light absorptive semiconductor layer 124, thereby improving the light absorption efficiency of the PD 120.

In consideration of a thickness of the PD 120, a DOF of the microlens 140, a thickness of a transparent insulating layer that may be formed between the PD 120 and the microlens 140, and process tolerances, the thickness t3 of the substrate 110 may be formed within a range of the focal length of the microlens 140, ±5%, to improve the light absorption efficiency of the PD 120.

The reflective metal layer 160 may reflect light that is not absorbed by the light absorptive semiconductor layer 124, from among light incident through the microlens 140, again toward the light absorptive semiconductor layer 124 of the PD 120. Thus, the reflective metal layer 160 may function as, for example, the reflective layer 130 shown in FIGS. 2A and 2B.

A horizontal area of the reflective metal layer 160 may be less than a horizontal area of the PD 120. The horizontal area of the reflective metal layer 160 may be less than a horizontal area of the light absorptive semiconductor layer 124.

In another implementation, the reflective metal layer 160 may be formed to cover the entire first surface 112 of the substrate 110 or formed to have a larger horizontal area than the horizontal area of the PD 120. A thickness of the PD 120 (particularly, the thickness of the first conductivity-type semiconductor layer 122) may be less than the thickness t3 of the substrate 110. Thus, a beam size of light that is reflected by the reflective metal layer 160 and reaches the light absorptive semiconductor layer 124 may not be greatly reduced as compared with a beam size of light that reaches the reflective metal layer 160. Accordingly, even if the reflective metal layer 160 is formed to have a slightly larger horizontal area than the PD 120, the reflective metal layer 160 may sufficiently function as the reflective layer 130 shown in FIGS. 2A and 2B.

Therefore, light that is not absorbed by the light absorptive semiconductor layer 124 of the PD 120, from among light incident to the substrate 110 through the microlens 140, may be reflected by the reflective metal layer 160, reach the light absorptive semiconductor layer 124 again, and be absorbed by the light absorptive semiconductor layer 124. Accordingly, the light absorption efficiency of the PD 120 may be improved.

Figure 18:
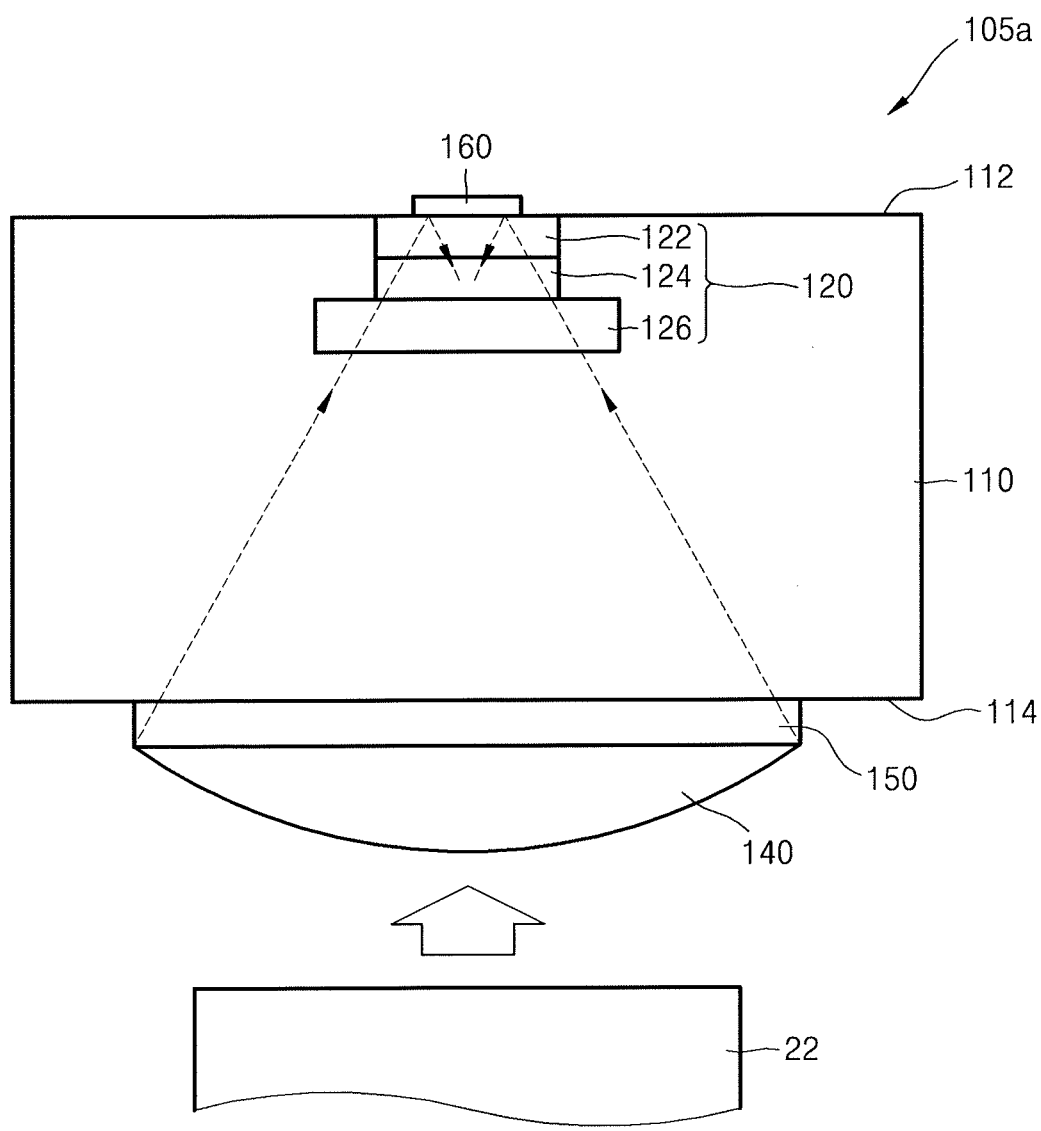
FIG. 18 illustrates a cross-sectional view of part of a photoelectric conversion device according to an example embodiment.

FIG. 18 illustrates a cross-sectional view of part of the photoelectric conversion device 105a according to an example embodiment.

Referring to FIG. 18, the photoelectric conversion device 105a may include a substrate 110, a PD 120, a microlens 140, an anti-reflection layer 150, and a reflective metal layer 160.

The anti-reflection layer 150 may be formed on a second surface 114 of the substrate 110. The anti-reflection layer 150 may reduce the reflection of light incident to the substrate 110.

Although FIG. 18 illustrates a case in which the anti-reflection layer 150 has an area corresponding to the area of the microlens 140, the anti-reflection layer 150 may have the same area as or a larger area than the area of the microlens 140. Thus, the anti-reflection layer 150 may be formed between the microlens 140 and the substrate 110. In another implementation, the anti-reflection layer 150 may be formed between the microlens 140 and the substrate 110 and on the second surface 114 of the substrate 110, on which the microlens 140 is not formed.

The anti-reflection layer 150 may minimize light, which is reflected by the second surface 114 of the substrate 110 and not incident to the photoelectric conversion device 105a, from among light incident from the fiber core 22 to the photoelectric conversion device 105a. Thus, the light absorption efficiency of the PD 120 may be improved.

Figure 19:
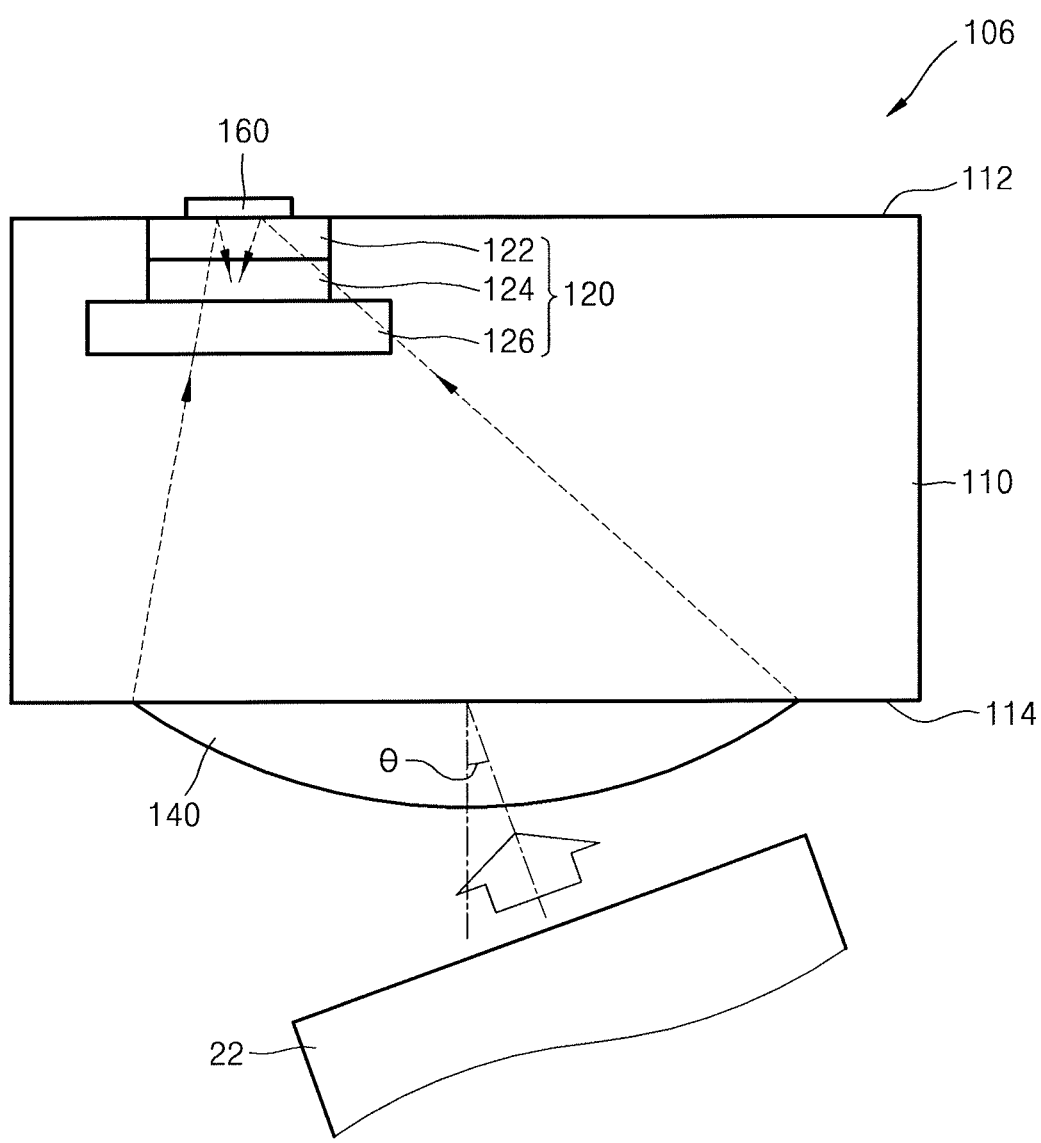
FIG. 19 illustrates a cross-sectional view of part of a photoelectric conversion device according to an example embodiment.

FIG. 19 illustrates a cross-sectional view of part of the photoelectric conversion device 106 according to an example embodiment.

Referring to FIG. 19, the photoelectric conversion device 106 may include a substrate 110, a PD 120, a microlens 140, and a reflective metal layer 160.

A direction in which light is incident from a fiber core 22 to the photoelectric conversion device 106 may have an angle θ with respect to a normal line of a second surface 114 of the substrate 110. Thus, a central axis of an optical cable including the fiber core 22 may have an angle θ with respect to the normal line of the second surface 114 of the substrate 110 and correspond to the microlens 140.

Figure 20:
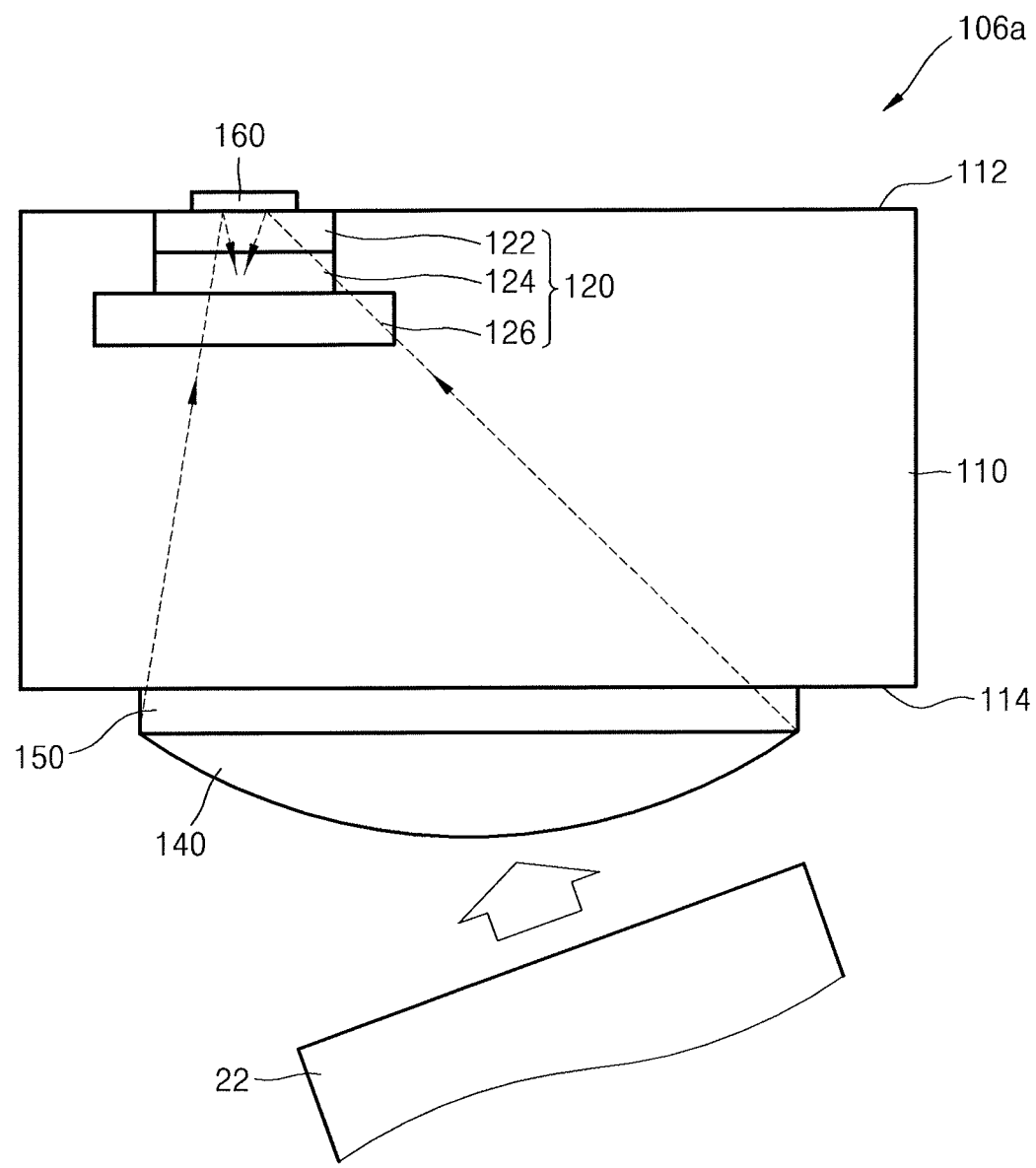
FIG. 20 illustrates a cross-sectional view of part of a photoelectric conversion device according to an example embodiment.

FIG. 20 illustrates a cross-sectional view of part of the photoelectric conversion device 106a according to an example embodiment.

Referring to FIG. 20, the photoelectric conversion device 106a may include a substrate 110, a PD 120, a microlens 140, an anti-reflection layer 150, and a reflective metal layer 160.

The anti-reflection layer 150 may be formed on a second surface 114 of the substrate 110. The anti-reflection layer 150 may serve to reflect reflection of light incident to the substrate 110.

Although FIG. 20 illustrates a case in which the anti-reflection layer 150 has an area corresponding to the area of the microlens 140, the anti-reflection layer 150 may have the same area as or a larger area than the area of the microlens 140. Thus, the anti-reflection layer 150 may be formed between the microlens 140 and the substrate 110. In another implementation, the anti-reflection layer 150 may be formed between the microlens 140 and the substrate 110 and on a second surface 114 of the substrate 110, on which the microlens 140 is not formed.

The anti-reflection layer 150 may minimize light, which is reflected by the second surface 114 of the substrate 110 and not incident to the photoelectric conversion device 106a, from among light incident from the fiber core 22 to the photoelectric conversion device 106a. Thus, the light absorption efficiency of the PD 120 may be improved.

Figure 21:
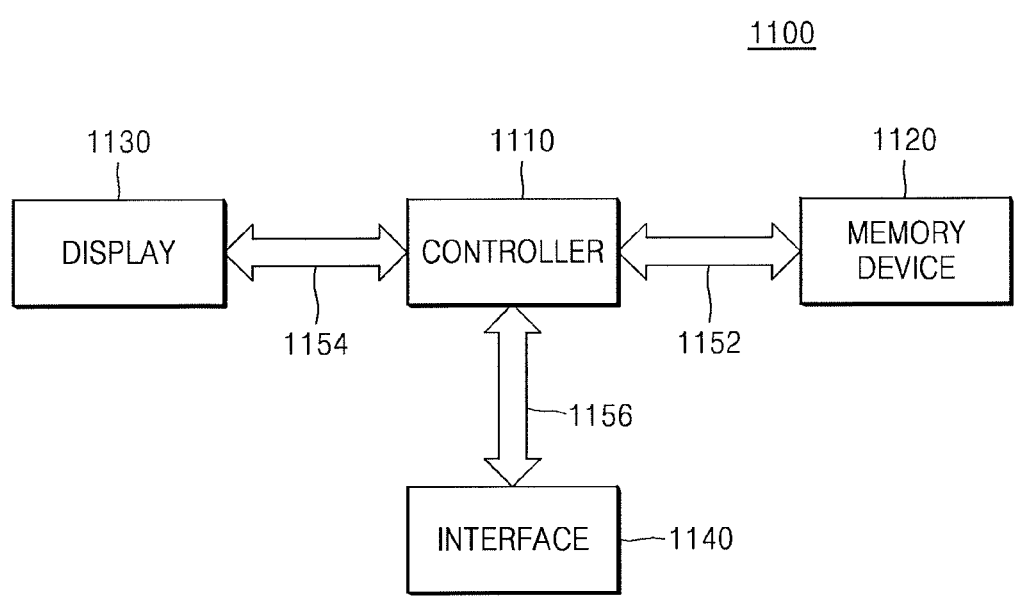
FIG. 21 illustrates a schematic diagram of a system including an optical signal receiving unit according to an example embodiment.

FIG. 21 illustrates a schematic diagram of a system 1100 including an optical signal receiving unit according to an example embodiment.

Referring to FIG. 21, the system 1100 may include a controller 1110, a memory device 1120, a display 1130, and an interface 1140. The system 1100 may be a mobile system or a system configured to transmit or receive information.

The controller 1110, which may be configured to control an execution program in the system 1100, may include a microprocessor, a digital signal processor, a microcontroller, or a similar device thereto.

The memory device 1120 may store codes and/or data for operating the controller 1110, or store data processed by the controller 1110. The memory device 1120 may include, for example, a volatile/non-volatile memory, a hard disk, or a solid-state drive (SSD).

The display 1130 may include a display apparatus configured to show results processed by the system 1100 and a display device configured to drive the display apparatus.

The interface 1140 may be a data transmission path between the system 1100 and another external device.

The controller 1110 may communicate with the memory device 1120, the display 1130, and the interface 1240 through communication channels 1152, 1154, and 1156, respectively. For example, at least some of the communication channels 1152, 1154, and 1156 may be the optical signal receiving unit 1 shown in FIG. 1, and the photoelectric conversion device 100 of the optical signal receiving unit 1 may correspond to each of the photoelectric conversion devices 100, 100a, 100b, 100c, 100d, 101, 101a, 101b, 101c, 101d, 102, 103, 104, 104a, 104b, 105, 105a, 106, and 106a shown in FIGS. 2A through 20.

The system 1100 may further include an input/output (I/O) device. The I/O device may be used to input or output data to or from the system 1100. The system 1100 may receive or output data using the I/O device. The I/O device may be, for example, a keypad, a keyboard, a mouse, or a printer.

The communication channels 1152, 1154, and 1156 included in the system 1100 may process optical signals for high-speed communication using a photoelectric conversion device with improved optical efficiency. Thus, the communication channels 1152, 1154, and 1156 may process high-capacity optical signals at a high efficiency.

Figure 22:
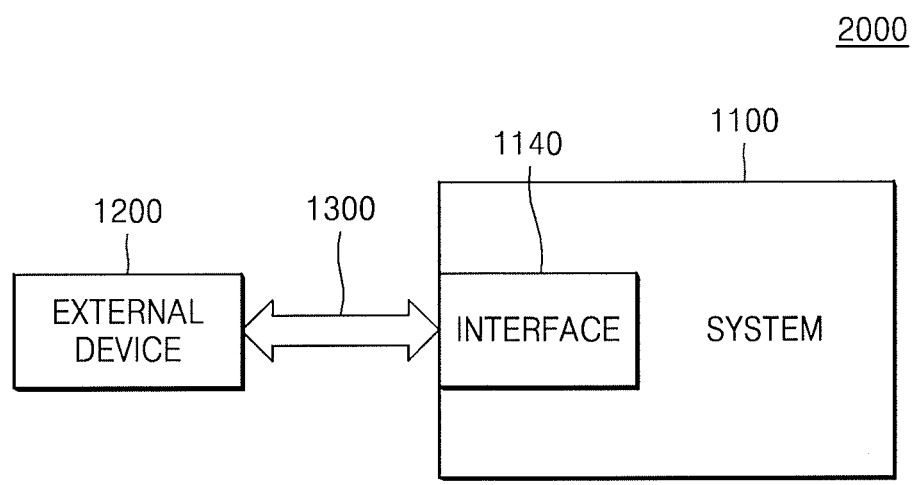
FIG. 22 illustrates a schematic diagram of a system and an external device connected through an optical signal receiving unit according to an example embodiment.

FIG. 22 illustrates a schematic diagram of a system 1100 and an external device 1200 connected through an optical signal receiving unit according to an example embodiment.

Referring to FIG. 22, the system 1100, including an interface 1140, may be connected to the external device 1200 through a communication cable 1300 to constitute a network 2000. The external device 1200 may be, for example, an external system or an external storage device. The communication cable 1300 may be, for example, an active optical cable. The communication cable 1300 may be the optical signal receiving unit 1 shown in FIG. 1, and a photoelectric conversion device 100 of the optical signal receiving unit 1 may correspond to each of the photoelectric conversion devices 100, 100a, 100b, 100c, 100d, 101, 101a, 101b, 101c, 101d, 102, 103, 104, 104a, 104b, 105, 105a, 106, and 106a shown in FIGS. 2A through 20.

Since the communication cable 1300 may process optical signals for high-speed communication using a photoelectric conversion device with improved optical efficiency, the system 1100 may transmit or receive a large amount of data to or from the external device 1200 at a high speed.

By way of summation and review, in an electronic device, loss may occur during conversion of an optical signal into an electric signal, or a connection device having a relatively large size may be needed.

As described above, embodiments may provide a photoelectric conversion device and an optical signal receiving unit having a photodiode (PD), which may minimize loss during conversion of an optical signal into an electric signal and be downscaled.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photoelectric conversion device, comprising:
a substrate having a first surface and a second surface that is an opposite side of the first surface, wherein the first surface is a light incidence surface;
a photodiode (PD) formed at the first surface of the substrate, the PD including a first conductivity-type semiconductor layer, a second conductivity-type semiconductor layer, and a light absorptive semiconductor layer interposed between the first and second conductivity-type semiconductor layers, the first conductivity-type semiconductor layer, the light absorptive semiconductor layer, and the second conductivity-type semiconductor layer being arranged in a vertical direction from the first surface of the substrate;
a reflective layer formed on the second surface of the substrate; and
a microlens formed on the light incidence surface of the substrate, wherein:
a portion of the first conductivity-type semiconductor layer is positioned to receive a first portion of light from the light incident surface without said first portion of light first passing through the light absorptive semiconductor layer or the second conductivity-type semiconductor layer, and
a portion of the second conductivity-type semiconductor layer is positioned to receive a second portion of light from the light incident surface without said second portion of light first passing through the light absorptive semiconductor layer or the first conductivity-type semiconductor layer.

2. The device as claimed in claim 1, wherein the first conductivity-type semiconductor layer, the second conductivity-type semiconductor layer, and the light absorptive semiconductor layer each directly contact the substrate.

3. The device as claimed in claim 1, wherein the second conductivity-type semiconductor layer is interposed between the light absorptive semiconductor layer and the reflective layer.

4. The device as claimed in claim 3, wherein a horizontal area of the first conductivity-type semiconductor layer is less than a horizontal area of the second conductivity-type semiconductor layer.

5. The device as claimed in claim 3, wherein a horizontal area of the light absorptive semiconductor layer is less than a horizontal area of the second conductivity-type semiconductor layer.

6. The device as claimed in claim 3, wherein a horizontal area of the microlens is larger than a horizontal area of the light absorptive semiconductor layer.

7. The device as claimed in claim 3, wherein a center of the microlens is offset from a center of the light absorptive semiconductor layer.

8. The device as claimed in claim 7, further comprising a reflective metal layer covering a portion of the PD.

9. The device as claimed in claim 1, further comprising a lattice coupler formed in the first surface of the substrate and a waveguide interposed between the lattice coupler and the PD,
wherein the microlens is formed on the lattice coupler.

10. The device as claimed in claim 1, further comprising an anti-reflective layer interposed between the substrate and the microlens.

11. The device as claimed in claim 1, further comprising an optical isolator layer interposed between the substrate and the microlens.

12. The device as claimed in claim 1, wherein the reflective layer has a concave shape toward the PD.

13. An apparatus, comprising:
an optical input, the optical input receiving light traveling in a first direction;
a reflector, the light received at the optical input being directed to the reflector;
a lens disposed in a path of the light between the optical input and the reflector such that light from the optical input that impinges on the reflector passes through the lens, the lens directing the light to the reflector, at least some of the light impinging on the lens being directed in a direction different from the first direction; and
an optoelectronic element disposed in a path of the light, the optoelectronic element including a first conductivity-type semiconductor layer, a second conductivity-type semiconductor layer, and a light absorptive semiconductor layer interposed between the first and second conductivity-type semiconductor layers, the first conductivity-type semiconductor layer, the light absorptive semiconductor layer, and the second conductivity-type semiconductor layer being arranged in a vertical direction from a light incidence surface of the optoelectronic element, wherein
the first conductivity-type semiconductor layer is positioned to receive a first portion of light from the lens without said first portion of light first passing through the light absorptive semiconductor layer or the second conductivity-type semiconductor layer, and
the second conductivity-type semiconductor layer is positioned to receive a second portion of light from the lens without said second portion of light first passing through the light absorptive semiconductor layer or the first conductivity-type semiconductor layer.

14. The apparatus as claimed in claim 13, wherein all light input via the optical input and impinging on the reflector passes through the lens.

15. The apparatus as claimed in claim 13, wherein the lens is a refractive element and has a curve, and a normal to a tangent at the center of the lens intersects the lens, the optoelectronic element, and the reflector.

16. The apparatus as claimed in claim 13, wherein the lens is a refractive element and has a curve, a normal to a tangent at the center of the lens intersects the lens and the reflector, and the optoelectronic element is laterally offset from the center of the lens.

17. The apparatus as claimed in claim 13, wherein light input via the optical input impinges on the optoelectronic element at two opposite surfaces of the optoelectronic element.

\* \* \* \* \*